(12) United States Patent
Schmitzer et al.

(10) Patent No.: US 10,677,876 B2
(45) Date of Patent: Jun. 9, 2020

(54) POSITION DEPENDENT NON-CONTACT VOLTAGE AND CURRENT MEASUREMENT

(71) Applicant: Fluke Corporation, Everett, WA (US)

(72) Inventors: Christian Karl Schmitzer, Brunn/Gebirge (AT); Ronald Steuer, Hinterbruhl (AT); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 84 days.

(21) Appl. No.: 15/974,981

(22) Filed: May 9, 2018

(65) Prior Publication Data

US 2019/0346529 A1 Nov. 14, 2019

(51) Int. Cl.
*G01R 35/00* (2006.01)

(52) U.S. Cl.
CPC .................. *G01R 35/007* (2013.01)

(58) Field of Classification Search
CPC .............. G01D 5/2415; G01R 31/2601; G01R 31/3183; G01R 31/319; G01R 31/261; G01R 31/2623
See application file for complete search history.

(56) References Cited

U.S. PATENT DOCUMENTS

| 5,473,244 A | 12/1995 | Libove et al. |
| 5,477,135 A | 12/1995 | Baker |

(Continued)

FOREIGN PATENT DOCUMENTS

| CN | 2639905 Y | 9/2004 |
| EP | 1 249 706 B1 | 9/2007 |

(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.

(Continued)

*Primary Examiner* — Dominic E Hawkins
(74) *Attorney, Agent, or Firm* — Seed Intellectual Property Law Group LLP

(57) ABSTRACT

Systems and methods for operating and calibrating measurement devices are provided herein. The measurement devices generate reference current signals and sense the reference current signals in a conductor under test, which sensed signals are used to determine a calibration factor or a position of the conductor under test. A calibration system may control a calibration voltage source to selectively output calibration voltages in a calibration conductor. The calibration system may obtain data from the electrical parameter measurement device captured by the electrical parameter measurement device when measuring the calibration conductor. Such data may include one or more reference current measurements, one or more voltage measurements, etc. The calibration system utilizes the obtained measurements to generate calibration data which may be stored on the voltage measurement device for use thereby during subsequent operation. The calibration data may include one or more lookup tables, coefficients for one or more mathematical formulas, etc.

18 Claims, 18 Drawing Sheets

(56) References Cited

U.S. PATENT DOCUMENTS

| | | |
|---|---|---|
| 5,583,444 A | 12/1996 | Nakamura et al. |
| 5,973,501 A | 10/1999 | Reichard |
| 6,014,027 A | 1/2000 | Reichard |
| 6,043,640 A * | 3/2000 | Lauby ................ G01R 15/125 |
| | | 324/127 |
| 6,118,270 A | 9/2000 | Singer et al. |
| 6,644,636 B1 | 11/2003 | Ryan |
| 6,664,708 B2 | 12/2003 | Schlimak et al. |
| 6,812,685 B2 | 11/2004 | Steber et al. |
| 6,825,649 B2 | 11/2004 | Nakano |
| 7,084,643 B2 | 8/2006 | Howard et al. |
| 7,466,145 B2 | 12/2008 | Yanagisawa |
| 8,054,061 B2 | 11/2011 | Prance et al. |
| 8,222,886 B2 | 7/2012 | Yanagisawa |
| 8,680,845 B2 | 3/2014 | Carpenter et al. |
| 8,755,210 B2 * | 6/2014 | Kangas ............... H02J 13/0093 |
| | | 363/157 |
| 8,803,506 B2 | 8/2014 | Yanagisawa |
| 9,063,184 B2 | 6/2015 | Carpenter et al. |
| 9,201,100 B2 | 12/2015 | Yanagisawa |
| 9,615,147 B2 * | 4/2017 | Radosavljevic ..... G01R 22/065 |
| 9,651,584 B2 * | 5/2017 | Gunn ................... G01R 35/005 |
| 2002/0167303 A1 | 11/2002 | Nakano |
| 2007/0032974 A1 | 2/2007 | Muniraju et al. |
| 2007/0086130 A1 * | 4/2007 | Sorensen ............... G01R 15/16 |
| | | 361/62 |
| 2008/0116880 A1 | 5/2008 | McEachern et al. |
| 2009/0058398 A1 | 3/2009 | Ibuki |
| 2010/0060300 A1 | 3/2010 | Müller et al. |
| 2010/0090682 A1 | 4/2010 | Armstrong |
| 2010/0283539 A1 | 11/2010 | Yanagisawa |
| 2012/0200291 A1 | 8/2012 | Carpenter et al. |
| 2012/0253726 A1 | 10/2012 | Xu |
| 2012/0259565 A1 * | 10/2012 | Oshima .................. G01R 21/06 |
| | | 702/61 |
| 2012/0290240 A1 | 11/2012 | Fukui |
| 2012/0319674 A1 | 12/2012 | El-Essawy et al. |
| 2013/0076343 A1 * | 3/2013 | Carpenter .............. G01R 33/02 |
| | | 324/202 |
| 2013/0124136 A1 | 5/2013 | Neeley et al. |
| 2013/0147464 A1 * | 6/2013 | Tan .......................... G01R 1/22 |
| | | 324/126 |
| 2014/0035607 A1 | 2/2014 | Heydron et al. |
| 2014/0062459 A1 | 3/2014 | El-Essawy et al. |
| 2015/0042320 A1 | 2/2015 | Cadugan et al. |
| 2016/0047846 A1 * | 2/2016 | Sharma ................ G01R 15/207 |
| | | 324/251 |
| 2016/0061864 A1 | 3/2016 | White et al. |
| 2016/0080667 A1 | 3/2016 | Stuart et al. |
| 2016/0109486 A1 | 4/2016 | Yanagisawa |
| 2016/0119592 A1 | 4/2016 | Stuart et al. |
| 2018/0120362 A1 | 5/2018 | Viegas |

FOREIGN PATENT DOCUMENTS

| | | |
|---|---|---|
| EP | 3 450 995 A1 | 3/2019 |
| JP | 9-184866 A | 7/1997 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |

OTHER PUBLICATIONS

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," *IEEE Transactions on Instrumentation and Measurement* 61(9):2512-2518, 2012.

HIOKI, "3258 : Safety HiTESTER," Revised Edition 5, HIOKI E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.

Stuart et al., "Infrared Cameras Used as a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

Extended European Search Report for EP application No. 19173653.7, dated Sep. 26, 2019, 13 pages.

* cited by examiner

| X[mm] | Y[mm] | IREF1[pA] | VCAL1 | IREF2[pA] | VCAL2 | IREF3[pA] | VCAL3 |
|---|---|---|---|---|---|---|---|
| -14.00 | -14.00 | 95991 | 2.2490 | 285078 | 1.4713 | 95991 | 2.2490 |
| -12.00 | -14.00 | 97249 | 2.2080 | 422909 | 1.3576 | 97249 | 2.2080 |
| -10.00 | -14.00 | 98259 | 2.1784 | 604488 | 1.2966 | 98259 | 2.1784 |
| -8.00 | -14.00 | 99053 | 2.1582 | 738948 | 1.2715 | 99053 | 2.1582 |
| -6.00 | -14.00 | 99671 | 2.1436 | 832442 | 1.2579 | 99671 | 2.1436 |
| -4.00 | -14.00 | 99993 | 2.1363 | 907328 | 1.2487 | 99993 | 2.1363 |
| -2.00 | -14.00 | 100108 | 2.1342 | 97120 | 1.2415 | 10010 | 2.1342 |
| 0.00 | -14.00 | 100014 | 2.13951 | 1.2353 | 10001 | 10001 | 2.13951 |
| 2.00 | -14.00 | 99857 | 2.1448 | 1.2325 | 99857 | 99857 | 2.14481 |
| 4.00 | -14.00 | 99537 | 2.1559 | 1.2299 | 99537 | 99537 | 2.15591 |
| 6.00 | -14.00 | 99215 | 2.16996 | 1.2283 | 99215 | 99215 | 2.16991 |
| 8.00 | -14.00 | 99012 | 2.179 | 1.2282 | 99042 | 99042 | 2.17911 |
| 10.00 | -14.00 | 98848 | 2.18 | 1.2278 | 98848 | 98848 | 2.18581 |
| -16.00 | -12.00 | 99444 | 2.1404 | 220854 | 1.5864 | 99444 | 2.1404 |
| -14.00 | -12.00 | 101100 | 2.0982 | 262848 | 1.4951 | 101100 | 2.0982 |
| -12.00 | -12.00 | 102529 | 2.0610 | 323279 | 1.4172 | 102529 | 2.0610 |
| -10.00 | -12.00 | 103696 | 2.0358 | 393680 | 1.3630 | 103696 | 2.0358 |
| -8.00 | -12.00 | 104598 | 2.0157 | 457881 | 1.3296 | 103777 | 2.0158 |

FIG. 11

| DIST[mm] | ref_pk[pA] | CALF |
|---|---|---|
| 1 | 331138 | 1.0725 |
| 2 | 244567 | 1.0771 |
| 3 | 197113 | 1.0813 |
| 4 | 162398 | 1.0865 |
| 5 | 140042 | 1.0912 |
| 6 | 119995 | 1.0984 |
| 7 | 105925 | 1.1057 |
| 8 | 92459 | 1.1156 |
| 9 | 82842 | 1.1256 |
| 10 | 74326 | 1.1374 |
| 11 | 68030 | 1.1489 |
| 12 | 62288 | 1.1628 |
| 13 | 57220 | 1.1787 |
| 14 | 52818 | 1.1962 |
| 15 | 48493 | 1.2177 |
| 16 | 45661 | 1.2358 |

FIG. 12

POSITION DEPENDENT NON-CONTACT VOLTAGE AND CURRENT MEASUREMENT

BACKGROUND

Technical Field

The present disclosure generally relates to electrical parameter measurement devices, and more particularly, to position dependent calibration for electrical parameter measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit.

Further, for some electrical parameter measurement devices, such as current clamps or split core transformers, a conductor under test may be free to be positioned at various physical locations within a front end or probe end of the measurement device. In certain instances, the variable position of the conductor under test may negatively affect the measurement of one or more electrical parameters (e.g., voltage, current, power) of the conductor under test, thereby leading to inaccurate measurement results. Thus, it would be advantageous to determine the position of the conductor under test and/or to compensate for the determined position when performing measurement of one or more electrical parameters.

BRIEF SUMMARY

An electrical parameter measurement device may be summarized as including: a front end that includes an opening that is sized and dimensioned to receive a conductor under test; a plurality of conductive sensors positioned proximate the front end; one or more reference voltage sources coupled to the plurality of conductive sensors, the one or more reference voltage sources operative to output a reference voltage in each of the conductive sensors; control circuitry communicatively coupled to the one or more reference voltage sources and the plurality of conductive sensors, wherein the control circuitry, in operation: controls the one or more reference voltage sources to output a reference voltage in each of the conductive sensors; for each of the conductive sensors, obtains a reference current signal data point indicative of a reference signal that is measured by the conductive sensor when the respective reference voltage source outputs the reference voltage in the conductive sensor and the conductor under test is positioned in the opening of the front end of the electrical parameter measurement device; and determines a calibration factor to be applied to an electrical parameter measurement of the conductor under test based at least in part on the reference current signal data points obtained for each of the plurality of conductive sensors.

The control circuitry, in operation, may apply the determined calibration factor to the electrical parameter measurement to generate a calibrated electrical parameter measurement. The electrical parameter measurement may include one or more of voltage, current, or power. The plurality of conductive sensors may include two or three conductive sensors. The electrical parameter measurement device may include a non-contact voltage measurement device, a current clamp or a split-core transformer. The control circuitry, in operation, may interpolate between a plurality of previously determined calibration points using the reference current signal data points to determine the calibration factor to be applied to the electrical parameter measurement. The control circuitry, in operation, may input the reference current signal data points into a previously determined calibration formula to determine the calibration factor to be applied to the electrical parameter measurement. The plurality of conductive sensors may be positioned proximate the front end of the electrical parameter measurement device such that, for each set of reference current signal data points obtained for the plurality of conductive sensors, the control circuitry determines a single position of the conductor under test. The control circuitry may determine the calibration factor based at least in part on the determined single position of the conductor under test. At least two of the plurality of conductive sensors may be coplanar with each other. Each of the plurality of conductive sensors may have a length dimension and a width dimension, and the length dimension is larger than the width dimension. The control circuitry, in operation, may determine a calibration factor for each of the reference current signal data points. The control circuitry, in operation, may determine a weighted combination of the calibration factors for each of reference current signal data points to use as the calibration factor. The weighted combination may include at least one of a linear weighted combination or an exponential weighted combination.

A calibration system operative to calibrate an electrical parameter measurement device, wherein the electrical parameter measurement device, in operation, generates reference current signals in a plurality of conductive sensors and senses the reference current signals in a conductor under test via the plurality of conductive sensors, be summarized as including: a controllable calibration voltage source operative to selectively output a voltage in a calibration conductor; a conductor position control system operative to selectively control a position of the calibration conductor relative to the plurality of conductive sensors of an electrical parameter measurement device under calibration; and control circuitry communicatively coupleable to the controllable calibration voltage source, the conductor position control system, and the electrical parameter measurement device, wherein the control circuitry, in operation: obtains a plurality of calibration points, wherein to obtain each of the calibration points, the control circuitry: controls the conductor position control system to move the calibration conductor to a new physical position proximate the plurality of conductive sensors of the electrical parameter measurement device; controls the electrical parameter measurement device to output a reference voltage in each of the conductive sensors; for each of the conductive sensors, obtains a reference current signal data point indicative of a reference signal that is measured by the conductive sensor; for each of the conductive sensors, determines a calibration factor based at least in part on the reference current signal data point obtained for the conductive sensor, a known voltage of the calibration conductor, and a measured voltage of the calibration conductor received from the electrical parameter measurement device; logically associates the plurality of calibration factors with the current position of the calibration conductor; and determines calibration data based on the obtained plurality of calibration points; and stores the calibration data on at least one nontransitory processor-readable storage medium for subsequent use by one or more electrical parameter measurement devices.

The calibration data may include a lookup table that, in operation, allows an electrical parameter measurement device to determine a calibration factor for particular reference current signal measurements. The calibration data may include coefficients for one or more mathematical formulas.

A method of operating a calibration system to calibrate an electrical parameter measurement device, wherein the electrical parameter measurement device, in operation, generates reference current signals in a plurality of conductive sensors and senses the reference current signals in a conductor under test via the plurality of conductive sensors, may be summarized as including: obtaining a plurality of calibration points by, for each calibration point: moving a calibration conductor to a new physical position proximate the plurality of conductive sensors of the electrical parameter measurement device while the electrical parameter measurement device outputs a reference voltage in each of the conductive sensors; for each of the conductive sensors of the electrical parameter measurement device, obtaining a reference current signal data point indicative of a reference signal that is measured by the conductive sensor; for each of the conductive sensors, determining a calibration factor based at least in part on the reference current signal data point obtained for the conductive sensor, a known voltage of the calibration conductor, and a measured voltage of the calibration conductor received from the electrical parameter measurement device; logically associating the plurality of calibration factors with the current position of the calibration conductor; and determining calibration data based on the obtained plurality of calibration points; and storing the calibration data on at least one nontransitory processor-readable storage medium for subsequent use by one or more electrical parameter measurement devices.

Determining calibration data may include generating a lookup table that, in operation, allows the electrical parameter measurement device to determine a calibration factor for particular reference current signal measurements. Determining calibration data may include determining coefficients for one or more mathematical formulas.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 11 is a table that shows position dependent calibration factors for three conductive sensors at various positions, according to one non-limiting illustrated implementation.

FIG. 12 is a table that shows position dependent calibration factors for a single conductive sensor when a conductor under test is positioned at various distances from the conductive sensor, according to one non-limiting illustrated implementation.

DETAILED DESCRIPTION

Figure 1A:
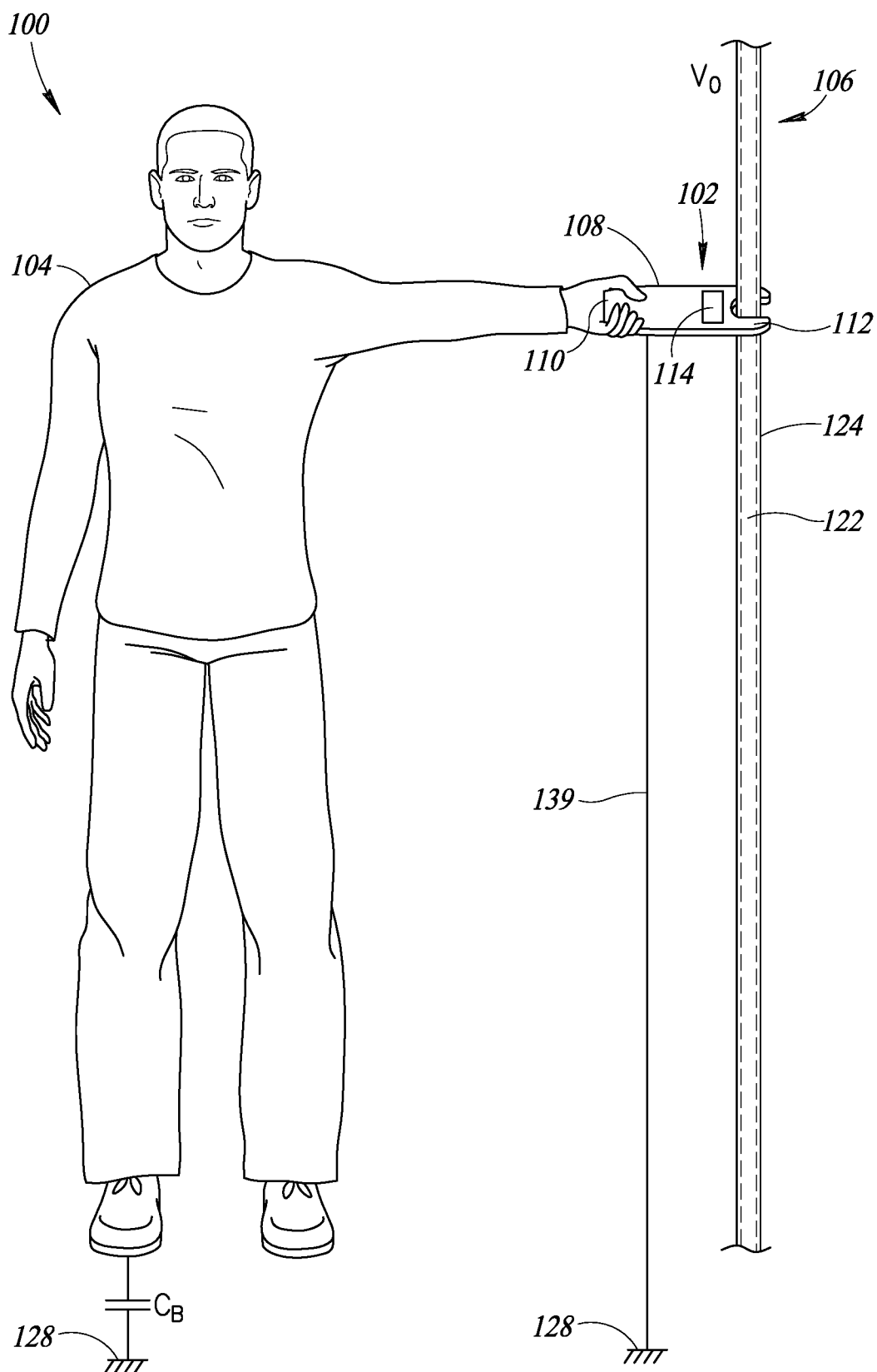
FIG. 1A is a pictorial diagram of an environment in which a non-contact voltage measurement device including a reference signal type voltage sensor may be used by an operator to measure AC voltage present in an insulated wire without requiring galvanic contact with the wire, according to one illustrated implementation.

Systems and methods of the present disclosure advantageously provide for calibration of electrical parameter measurement devices, such as contact and non-contact "reference signal" type measurement devices, clamp meters, and split core transformers, as well as conductor position determination for such devices and other devices. Initially, with reference to FIGS. 1A-4, various examples of reference signal type measurement devices are discussed. Then, with respect to FIGS. 5-20, various calibration systems and associated devices and methods are discussed.

In at least some implementations, the calibration systems and methods disclosed herein may be used to calibrate non-contact measurement devices in which measurement of one or more alternating current (AC) electrical parameters in an insulated wire is performed without requiring a galvanic connection between the insulated wire and a test electrode or probe. The calibration systems and methods may also be used to calibrate conventional contact type measurement devices that generate and detect reference signals and which utilize conductive test leads or probes in galvanic contact with conductors under test. Non-limiting examples of measurement devices with which the implementations discussed herein may be used include digital multimeters, current clamps and split-core transformers.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Reference Signal Type Non-Contact Voltage Measurement Devices

The following discussion provides examples of systems and methods for measuring alternating current (AC) voltage of an insulated (e.g., insulated wire) or blank uninsulated conductor (e.g., bus bar) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement device is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise. Although the discussion below focuses on non-contact reference signal type measurement devices, it should be appreciated that the calibration systems and methods disclosed herein may additionally or alternatively be used to calibration contact reference signal voltage measurement devices (e.g., a digital multimeter (DMM) that generates and detects reference signals). Thus, the discussion below may apply to calibration subsystems of measurement devices which may be used to determine one or more calibration factors and/or the position of a conductor under test, as well as measurement subsystems of measurement devices that are used to obtain the measurements of one or more electrical parameters (e.g., voltage, current, power).

Figure 1B:
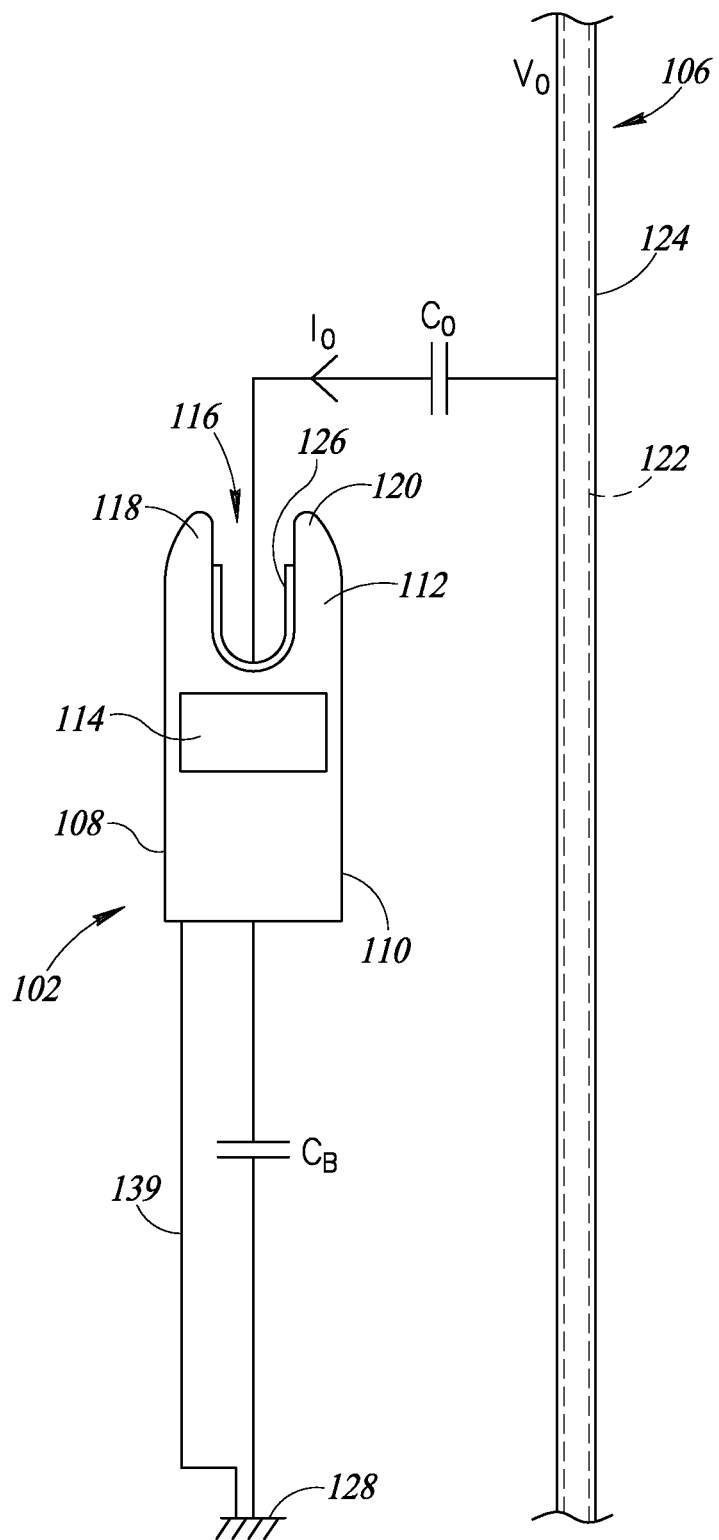
FIG. 1B is a top view of the non-contact voltage measurement device of FIG. 1A, showing a coupling capacitance formed between the insulated wire and a conductive sensor of the non-contact voltage measurement device, an insulated conductor current component, and a body capacitance between the non-contact voltage measurement device and the operator, according to one illustrated implementation.

FIG. 1A is a pictorial diagram of an environment 100 in which a non-contact voltage measurement device 102 that includes a reference signal type voltage sensor or system may be used by an operator 104 to measure AC voltage present in an insulated wire 106 without requiring galvanic contact between the non-contact voltage measurement device and the wire 106. FIG. 1B is a top plan view of the non-contact voltage measurement device 102 of FIG. 1A, showing various electrical characteristics of the non-contact voltage measurement device during operation. The non-contact voltage measurement device 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement device 102. The user interface 114 may include any number of inputs (e.g., buttons, dials, switches, touch sensor) and any number of outputs (e.g., display, LEDs, speakers, buzzers). The non-contact voltage measurement device 102 may also include one or more wired and/or wireless communications interfaces (e.g., USB, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement device 102. Although not shown for clarity, the sensor 126 may be disposed inside of the housing 108 to prevent physical and electrical contact between the sensor and other objects. Further, although a single sensor 126 is depicted in this example, in other implementations a plurality of spaced apart sensors may be provided, as discussed below.

As shown in FIG. 1A, in use the operator 104 may grasp the grip portion 110 of the housing 108 and place the probe portion 112 proximate the insulated wire 106 so that the non-contact voltage measurement device 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement device 102 to be positioned proximate the insulated wire 106. Examples of various probe portions and sensors are discussed below.

The operator's body acting as a reference to earth/ground may only be in some implementations. Alternatively a direct connection to earth 128 via a test lead 139 can be used. The non-contact measurement functionality discussed herein is not limited to applications only measuring against earth. The outside reference may be capacitively or directly coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement device 102 to measure AC voltage are discussed below with reference to FIGS. 2-4.

Figure 2:
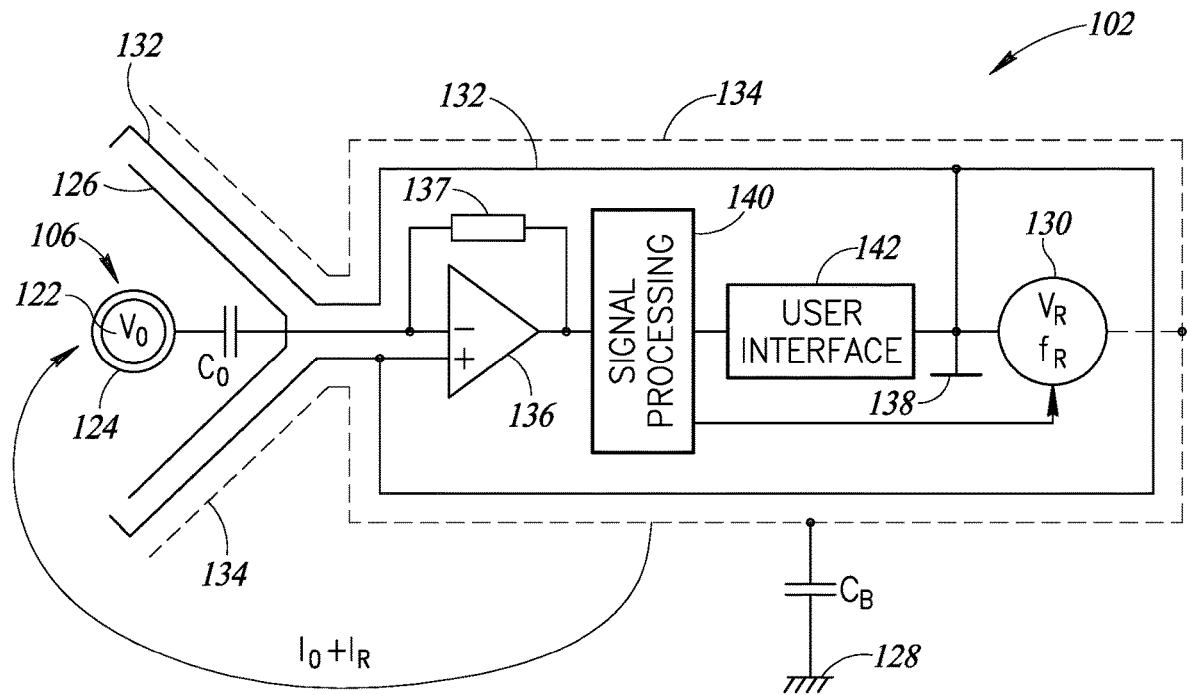
FIG. 2 is a schematic diagram of various internal components of a non-contact voltage measurement device, according to one illustrated implementation.

FIG. 2 shows a schematic diagram of various internal components of the non-contact voltage measurement device 102 also shown in FIGS. 1A and 1B. In this example, the conductive sensor 126 of the non-contact voltage measurement device 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement device 102 has a body capacitance ($C_B$) to ground. Also a direct conductive ground coupling by a wire (e.g., test lead 139) can be used as shown in FIGS. 1A and 1B. Thus, as shown in FIGS. 1B and 2, the AC voltage signal ($V_O$) in the wire 122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential. The AC voltage ($V_O$) in the wire 122 to be measured has a connection to an external ground 128 (e.g., neutral). The non-contact voltage measurement device 102 itself also has a capacitance to ground 128, which consists primarily of the body capacitance ($C_B$) when the operator 104 (FIG. 1) holds the non-contact voltage measurement device in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 126 and loops back to the external ground 128 through the housing 108 of the non-contact voltage measurement device and the body capacitor ($C_B$) to ground 128. The current signal ($I_O$) is dependent on the distance between the conductive sensor 126 of the non-contact voltage measurement device 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($I_O$), the non-contact voltage measurement device 102 includes a common mode reference voltage source 130 which generates an AC reference voltage ($V_R$) which has a reference frequency ($f_R$) different from the signal voltage frequency ($f_O$).

To reduce or avoid stray currents, at least a portion of the non-contact voltage measurement device 102 may be surrounded by a conductive internal ground guard or screen 132 which causes most of the current to run through the conductive sensor 126 that forms the coupling capacitor ($C_O$) with the conductor 122 of the insulated wire 106. The internal ground guard 132 may be formed from any suitable conductive material (e.g., copper) and may be solid (e.g., foil) or have one or more openings (e.g., mesh).

Further, to avoid currents between the internal ground guard 132 and the external ground 128, the non-contact voltage measurement device 102 includes a conductive reference shield 134. The reference shield 134 may be formed from any suitable conductive material (e.g., copper) and may be solid (e.g. sheet metal, sputtered metal inside a plastic enclosure, flexible (e.g., foil), or have one or more openings (e.g., mesh). The common mode reference voltage source 130 is electrically coupled between the reference shield 134 and the internal ground guard 132, which creates a common mode voltage or reference signal having the reference voltage ($V_R$) and the reference frequency ($f_R$) for the non-contact voltage measurement device 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement device 102. In at least some implementations, the internal ground guard 132 also surrounds some or all of the electronics of the non-contact voltage measurement device 102 to avoid the AC reference voltage ($V_R$) coupling into the electronics.

As noted above, the reference shield 134 is utilized to inject a reference signal onto the input AC voltage signal ($V_O$) and, as a second function, minimizes the guard 132 to earth ground 128 capacitance. In at least some implementations, the reference shield 134 surrounds some or all of the housing 108 of the non-contact voltage measurement device 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement device 102.

The internal ground guard 132 and the reference shield 134 may provide a double layer screen around the housing 108 (see FIGS. 1A and 1B) of the non-contact voltage measurement device 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test. The guard 132 around the sensor 126 also reduces stray influences of adjacent wires close to the sensor.

As shown in FIG. 2, the non-contact voltage measurement device 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement device 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement device 102 may also include a user interface 142 (e.g., display) communicatively coupled to the signal processing module 140 to present the determined AC voltage ($V_O$) or to communicate by an interface to the operator 104 of the non-contact voltage measurement device.

Figure 3:
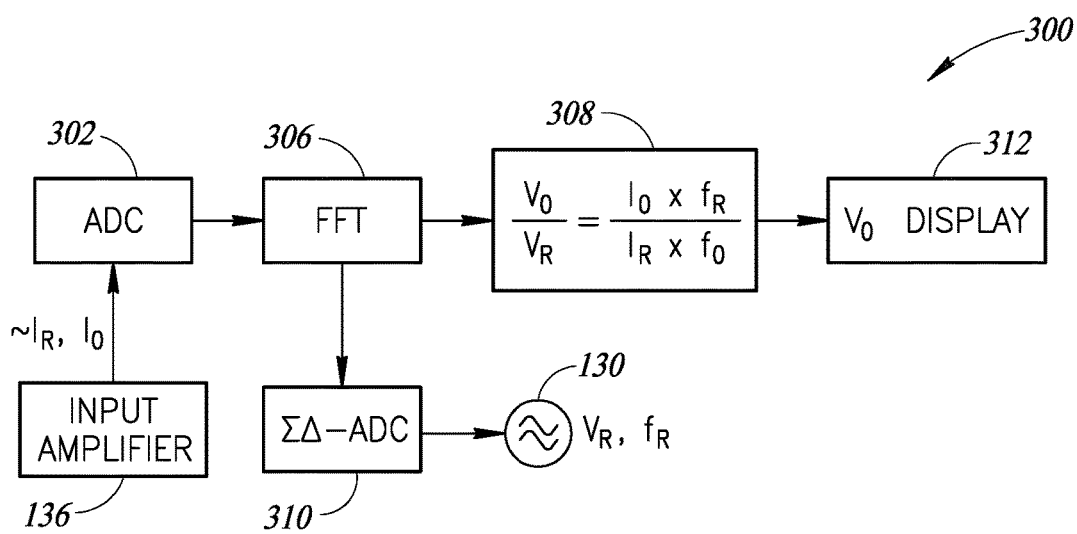
FIG. 3 is a block diagram which shows various signal processing components of a non-contact voltage measurement device, according to one illustrated implementation.
Figure 4:
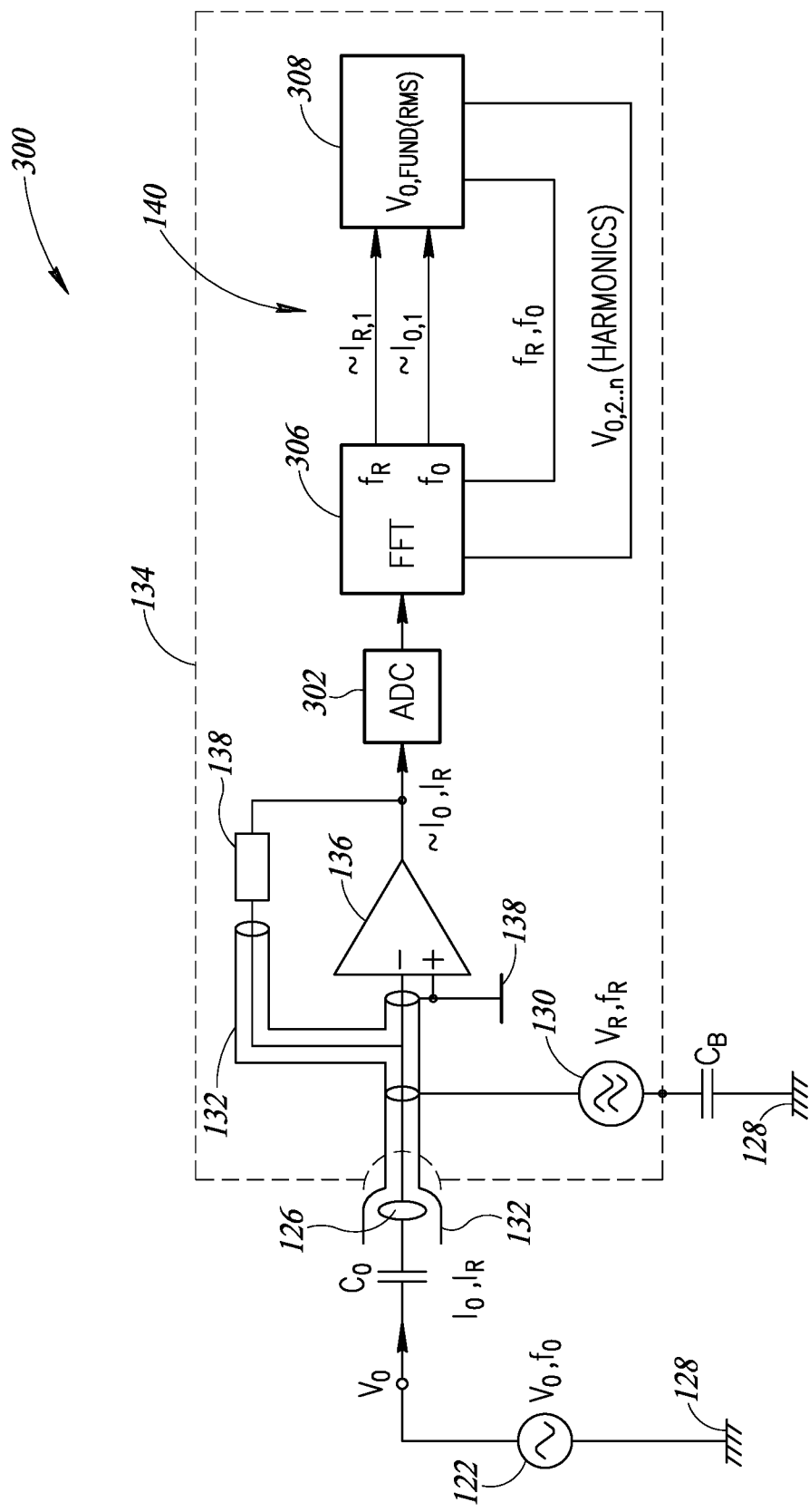
FIG. 4 is a schematic diagram of a non-contact voltage measurement device which implements a fast Fourier transform (FFT), according to one illustrated implementation.

FIG. 3 is a block diagram of a non-contact voltage measurement device 300 which shows various signal processing components of the non-contact voltage measurement device. FIG. 4 is a more detailed diagram of the non-contact voltage measurement device 300 of FIG. 3.

The non-contact voltage measurement device 300 may be similar or identical to the non-contact voltage measurement device 102 discussed above. Accordingly, similar or identical components are labeled with the same reference numerals. As shown, the input amplifier 136 converts the input current ($I_O + I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \qquad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

The signals with indices "0," which are related to the AC voltage ($V_O$), have different characteristics like frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes with different frequencies. In other implementations, analog electronic filters may also be used to separate "0" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above or the reference frequency is already known because it is generated by the system itself.

Figure 7:
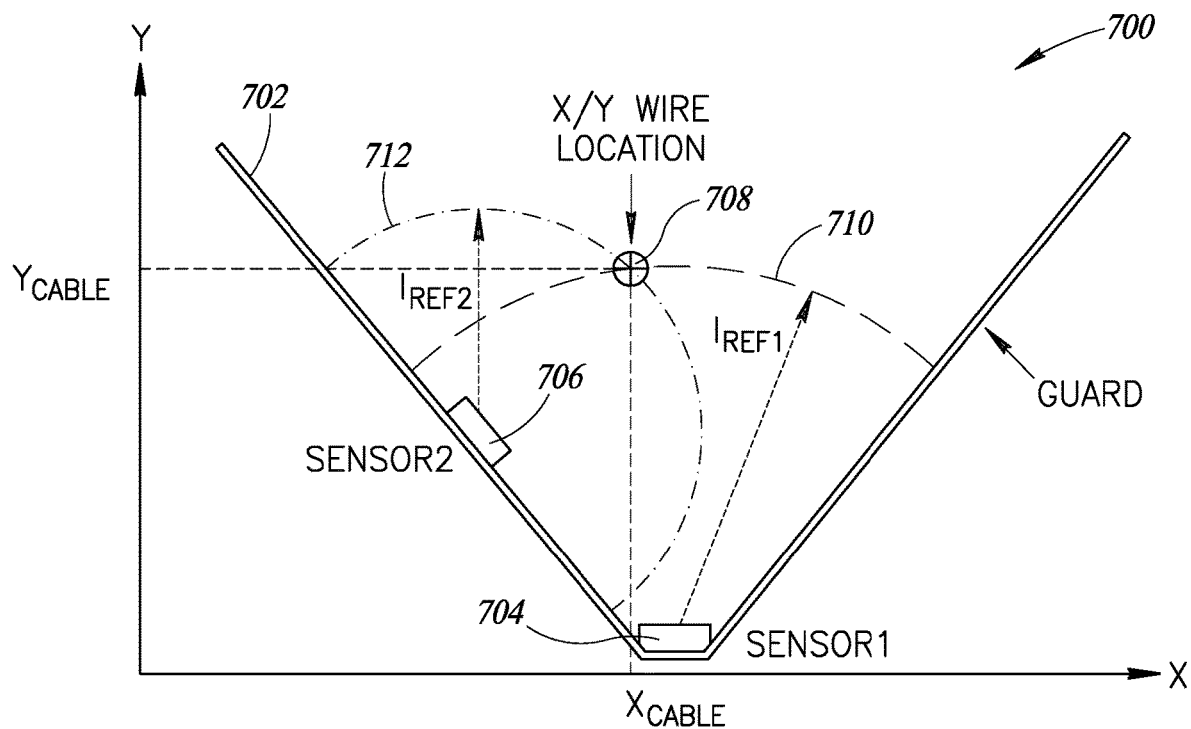
FIG. 7 is a schematic diagram of a V-shaped front end of an electrical parameter measurement device, showing two conductive sensors that may be used to determine the position of a conductor under test, wherein the positions of the two conductive sensors allow for accurate position determination for the conductor under test, according to one non-limiting illustrated implementation.

After the input current ($I_O+I_R$) has been conditioned by the input amplifier 136 and digitized by the ADC 302, the frequency components of the digital sensor current voltage signal may be determined by representing the signal in the frequency domain using the FFT 306 (see FIG. 7). When both of the frequencies ($f_O$) and ($f_R$) have been measured, frequency bins may be determined to calculate the fundamental magnitudes of the currents ($I_O$) and ($I_R$) from the FFT 306.

The magnitude of the current ($I_R$) and/or the current ($I_O$) may vary as a function of distance between the reference signal sensor or electrode (e.g., electrode 126) and the conductor 122 of the insulated wire 106. Thus, the system may compare the measured current ($I_R$) and/or the current ($I_O$) to expected respective currents to determine the distance between the reference signal sensor or electrode and the conductor 122.

Next, as indicated by a block 308 of FIG. 3, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which is done by calculating the square root of the squared harmonics sum, and which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($I_O$) that are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 3, a Sigma-Delta digital-to-analog converter ($\Sigma$-$\Delta$ DAC) 310 is used. The $\Sigma$-$\Delta$ DAC 310 uses a bit stream to create a waveform (e.g., sinusoidal waveform) signal with the defined reference frequency ($f_R$) and AC reference voltage ($V_R$). In at least some implementations, the $\Sigma$-$\Delta$ DAC 310 may generate a waveform that is in phase with the window of the FFT 306 to reduce jitter. Any other reference voltage generator can be used, such as a PWM which may use less computing power than a $\Sigma$-$\Delta$ DAC.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.288 kHz, for example, to get the same number of samples per cycle. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the $40^{th}$ harmonic and the $41^{st}$ harmonic for 60 Hz signals, and between the $48^{th}$ harmonic and $49^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

Calibration Systems and Methods

As discussed above, the reference voltage ($V_R$) and the reference frequency ($f_R$) generated by the voltage measurement device are known and may be measured at the output of the reference voltage source 130 (FIG. 2). The output voltage ($V_O$) is defined by Equation (1) above. In an ideal situation, if the reference voltage ($V_R$) is known, and all other parameters needed are the ratios $I_O/I_R$ and $f_R/f_O$, then no calibration of the voltage measurement device would be required. However, in practice, there are several influencing factors, such as the bandwidth of signal processing circuitry, leakage capacitances, and the particular position of the conductor under test relative to the measurement device, which lead to a deviation in output voltage measurements from the actual output voltage in a conductor under test. One factor is stray leakage capacitance between the sensor 126 (or sensors) and the environment, which tends to cause an increase in the reference current ($I_R$) and therefore a reduction in the ratio $I_O/I_R$. Also, direct capacitive coupling between the sensor 126 and the reference shield 134 leads to an offset which further increases the reference current ($I_R$). Such an increase in the reference current ($I_R$) from the ideal situation results in a calculation of the output voltage ($V_O$) that is less than the actual output voltage in a conductor under test. Accordingly, the calibration systems and methods discussed herein allow for accurate measurement of output voltage ($V_O$) or other parameter in a conductor under test using determined calibration parameters or factors that are dependent on the coupling capacitance ($C_O$) or, equivalently, the distance between each of one or more sensors and the conductor under test. As discussed further below, in at least some implementations a plurality of sensors is utilized, and the position of a conductor under test is determined by triangulation of reference currents measured by the plurality of sensors.

Figure 5:
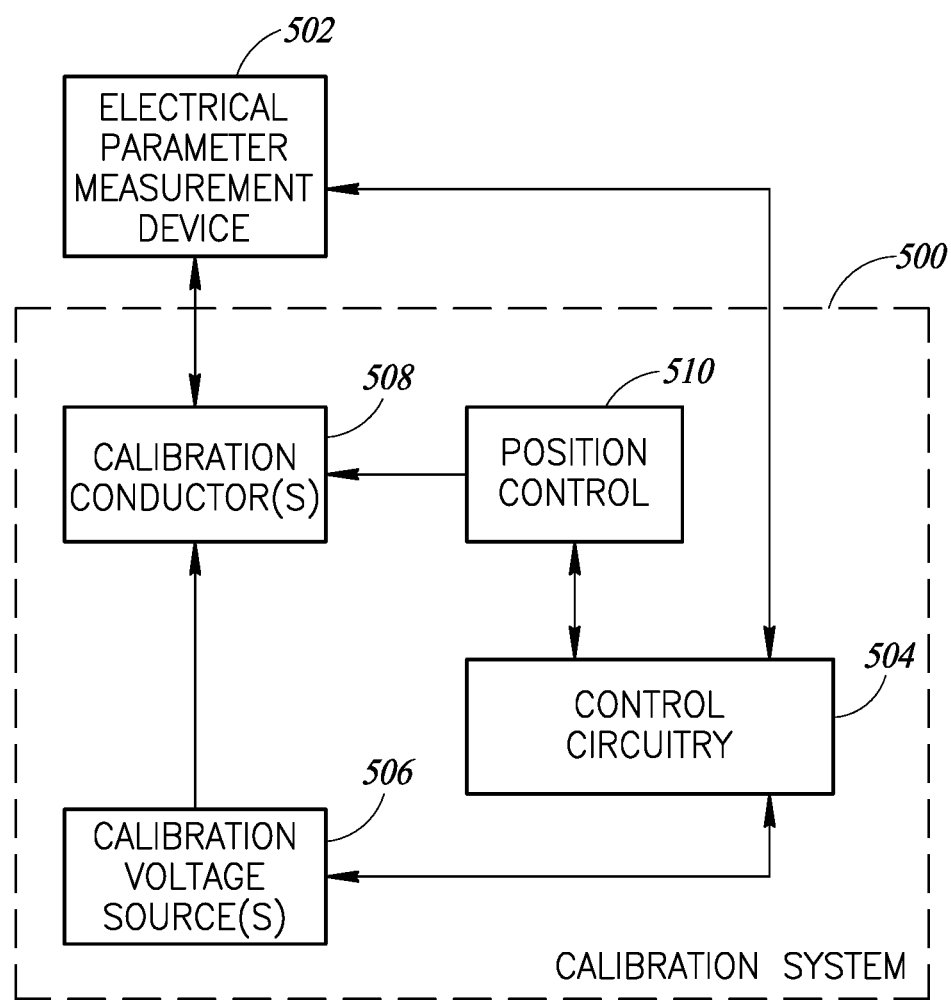
FIG. 5 is a schematic block diagram of a calibration system for an electrical parameter measurement device, such as the voltage measurement devices shown in FIGS. 1A-4, according to one illustrated implementation.

FIG. 5 shows a schematic block diagram of an example calibration system 500 that may be used to calibrate an electrical parameter measurement device 502 (e.g., DMM, current clamp, split core transformer). The electrical parameter measurement device 502 may be any non-contact or contact measurement device, such as a measurement device that generates and senses a reference signal. The calibration system 500 may include control circuitry 504 which controls the various functionality of the calibration system. The calibration system 500 may also include a calibration voltage source 506 that is operative to selectively output calibration or test voltages to a calibration conductor 508. The control circuitry 504 may be operatively coupled to the calibration voltage source 506 to control the operation thereof. The calibration system 500 may also include a position control subsystem 510 that is operative to selectively mechanically control the position of the calibration conductor 508 relative to the electrical parameter measurement device 502 during a calibration process. The calibration conductor 508 may be an insulated conductor for use in calibrating non-contact electrical parameter measurement devices, or may be an uninsulated conductor for use in calibrating contact type electrical parameter measurement devices.

The control circuitry 504 of the calibration system 500 may be operatively coupled to the electrical parameter measurement device 502 by any suitable wired or wireless connection. As discussed further below, the control circuitry 504 may be operative to send instructions or data to the electrical parameter measurement device 502 or to receive instructions or data therefrom. The control circuitry 504 controls the position control subsystem 510 to selectively adjust the position of the calibration conductor 508 within an opening or receiving portion of a front end or measurement end of the electrical parameter measurement device such that the capacitive coupling $C_O$ between each of the plurality of sensors and the calibration conductor is varied to modify the respective reference currents $I_R$ for the plurality of sensors to obtain different calibration points for a plurality of physical locations of the calibration conductor 508.

Generally, the control circuitry 504 may include at least one processor communicatively coupled to the calibration voltage source 506, the position control subsystem 510, and to at least one nontransitory processor-readable storage medium that stores at least one of processor-executable instructions or data. The control circuitry 504 may include any type of processing unit, such as one or more central processing units (CPUs), digital signal processors (DSPs), application-specific integrated circuits (ASICs), field programmable gate arrays (FPGAs), programmable logic controllers (PLCs), artificial neural network circuits or systems, or any other discrete or integrated logic components. The nontransitory processor-readable storage medium coupled to the control circuitry 504 may include any type of nontransitory volatile and/or non-volatile memory.

In at least some implementations, the control circuitry 504 may include a communications interface or a user interface. The user interface may facilitate user interaction with the calibration system 500. The user interface may include any number of inputs (e.g., buttons, dials, switches, touch sensor) and any number of outputs (e.g., display, LEDs, speakers, buzzers). For example, the user interface may include inputs that allow an operator to modify one or more adjustable settings of the calibration system 500 or the electrical parameter measurement device 502. The communications interface may implement one or more wired and/or wireless communications technologies (e.g., USB, Wi-Fi®, Bluetooth®) that allow the calibration system 500 to communicate with the electrical parameter measurement device 502 or with one or more local or remote external processor-based devices.

In at least some implementations, the output voltage ($V_O$) measurements of the electrical parameter measurement device 502 may be dependent on measured reference current signals ($I_R$) and/or the actual output voltage in the conductor under test. Thus, in at least some implementations, the calibration systems and methods discussed herein provide compensation for one or both of such parameters to allow for accurate measurement of the output voltage ($V_O$) at various voltages and various positions of the conductor under test relative to the electrical parameter measurement device 502, which various positions correspond to various combinations of levels of reference current ($I_R$) for the plurality of sensors (e.g., 2 sensors, 3 sensors) of the electrical parameter measurement device 502.

Generally, during a calibration process, the control circuitry 504 controls the calibration voltage source 506 to output a known calibration voltage (e.g., 100 VAC, 250 VAC, 800 VAC) to the calibration conductor 508 and controls the position control system 510 to move the calibration conductor to a known position (e.g., X/Y position) within a front end or measurement portion of the electrical parameter measurement device 502. The control circuitry 504 then receives data from the electrical parameter measurement device 502 obtained by the electrical parameter measurement device during measurement of the calibration voltage in the calibration conductor 508. Such data may include measured reference current signals ($I_R$) for a plurality of sensors, determined output voltages ($V_O$), etc. The electrical parameter measurement device 502 may obtain such data in the manner discussed above with reference to FIGS. 1A-4, for example. This process may be repeated a number of times when the calibration conductor 508 is located at different positions, and optionally at different calibration voltages.

For each of the plurality of positions of the calibration conductor 508 and for each of one or more calibration voltages (e.g., 100 VAC, 250 VAC, 800 VAC), the control circuitry 504 may obtain a plurality of calibration points associated with the calibration voltage. In at least some implementations, each of the calibration points includes reference current signal data points for each of the respective plurality of sensors of the electrical parameter measurement device and a calibration factor. A reference current signal data point is a measurement obtained from a sensor of the electrical parameter measurement device 502 that is indicative of the reference current signal that is measured by the sensor of the electrical parameter measurement device when the calibration voltage source 506 outputs the calibration voltage in the calibration conductor 508. The calibration factor may be a value indicative of a ratio of the known calibration voltage to a measured uncalibrated output voltage ($V_O$) data point obtained from a sensor of the electrical parameter measurement device that is determined by the electrical parameter measurement device based at least in part on the reference current signal data point (e.g., using Equation (1) above) for the sensor. For example, if the control circuitry 504 causes the calibration voltage source 506 to output 100 VAC in the calibration conductor 508, and a sensor of the electrical parameter measurement device 502 measures an output voltage of 110 VAC, then the calibration factor would be 100/110=0.909. For a particular measurement, the uncalibrated output voltage measured by the electrical parameter measurement device 502 may be multiplied by the calibration factor to provide the correct output voltage. Continuing with the example above, the uncalibrated output voltage of 110 VAC may be multiplied by the calibration factor of 0.909 to provide the actual output voltage of 100 VAC in the conductor under test.

As discussed further below, after obtaining calibration points, the control circuitry 504 may determine calibration data for the electrical parameter measurement device 502 based on the obtained plurality of calibration points. The calibration data may be dependent on the reference current signals measured by the plurality of sensors of the electrical parameter measurement device. In at least some implementations, the calibration data may also be dependent on a plurality of calibration voltages. The control circuitry 504 may then store the calibration data on at least one nontransitory processor-readable storage medium associated with the electrical parameter measurement device 502 for use by the electrical parameter measurement device or other electrical parameter measurement devices (e.g., with the same or similar physical characteristics) during subsequent operation thereof. The calibration data may include one or more lookup tables and/or coefficients for one or more mathematical formulas, for example.

Figure 6:
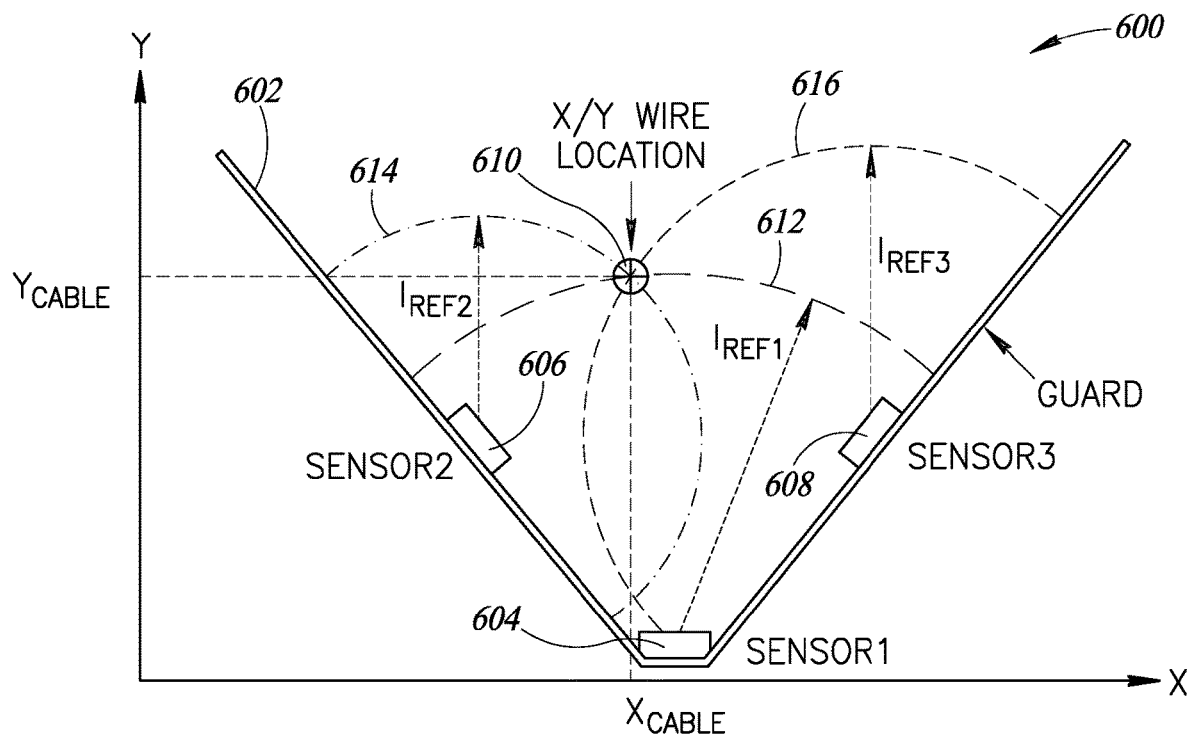
FIG. 6 is schematic diagram of a V-shaped front end of an electrical parameter measurement device, showing three conductive sensors that may be used to determine the position of a conductor under test, according to one non-limiting illustrated implementation.

FIG. 6 is schematic diagram of a V-shaped front end 600 of an electrical parameter measurement device, showing three conductive sensors 604, 606 and 608 disposed on a guard 602 that may be used to determine the position of a conductor 610 under test. Also shown are the magnitudes of reference currents 612, 614, and 616 measured by the sensors 604, 606, and 608, respectively, wherein each constant magnitude reference current is represented as an arcuate dashed line that has a specific distance that is indicative of the constant magnitude of the reference current, which indicates the possible positions of the conductor 610 under test determined by of the sensors. As shown, the three reference currents 612, 614, and 616 intersect at the X/Y location of the conductor 610 under test. Thus, using triangulation of the reference currents 612, 614, and 616 for the three sensors 604, 606, and 608, the location of the conductor 610 under test may be accurately determined.

As discussed further below, the location determination may be used to select or derive a calibration factor to be applied to an electrical parameter measurement of the electrical parameter measurement device. For example, a prior calibration process may be implemented to define a set of discrete data points, such as a calibration grid, that specify the calibration factor for any possible position of the conductor under test. The calibration process may result in position coordinates, the reference currents $I_{REF1}$, $I_{REF2}$, $I_{REF3}$ for each of the sensors 604, 606, and 608, respectively, and a calibration factor (e.g., $V_{CAL1}$, $V_{CAL2}$, $V_{CAL3}$) that indicates an amount of correction to be applied to a measurement of an electrical parameter (e.g., current, voltage, power). Similar to Equation (1) above, an unknown signal voltage $V_O$ may be calculated as follows:

$$V_O = \frac{I_{OX} \times f_R}{I_{RefX} \times f_{OX}} \times V_{Ref} \times V_{CALX} \qquad (2)$$

where $V_{CALX}$ is the calibration factor for a sensor X (i.e., X=1, 2, 3), $I_{OX}$ is the signal current from each sensor, $f_{OX}$ is the signal frequency (e.g., 50 Hz, 60 Hz) measured by each of the three sensors, $V_{REF}$ is the common mode reference voltage generated inside the electrical parameter measurement device, and $f_R$ is the frequency of the reference voltage.

FIG. 7 is a schematic diagram of a V-shaped front end 700 of an electrical parameter measurement device, showing two conductive sensors 704 and 706 disposed on a guard 702 that may be used to determine the position of a conductor 708 under test, wherein the positions of the two conductive sensors allow for accurate position determination for the conductor under test. In contrast, FIG. 8 is a schematic diagram of a V-shaped front end 800 of an electrical parameter measurement device, showing two conductive sensors 804 and 806 disposed on a guard 802 that may be used to determine the position of a conductor 808 under test, wherein the positions of the two conductive sensors may cause ambiguous or inaccurate position determination for the conductor under test.

Referring to FIG. 7, the sensor 704 is positioned at a bottom or base portion of the guard 702, and the sensor 706 is positioned on a left side or portion (as shown) of the guard. A first curved dashed line 710 represents a constant reference current magnitude detected by the sensor 704, and a second curved dashed line 712 represents a constant reference current magnitude detected by the sensor 706. As shown, the curves 710 and 712 intersect in only one location, which is the location of the conductor 708 under test. That is, the other theoretical intersection of the curves 710 and 712 would be outside of the V-shaped guard 702 and can therefore be ignored by the measurement device since that location is not a possible location for the conductor 708 under test. Thus, since there is only one possible intersection of the curves 710 and 712, the measurement device can accurately determine the location of the conductor 708 under test.

Figure 8:
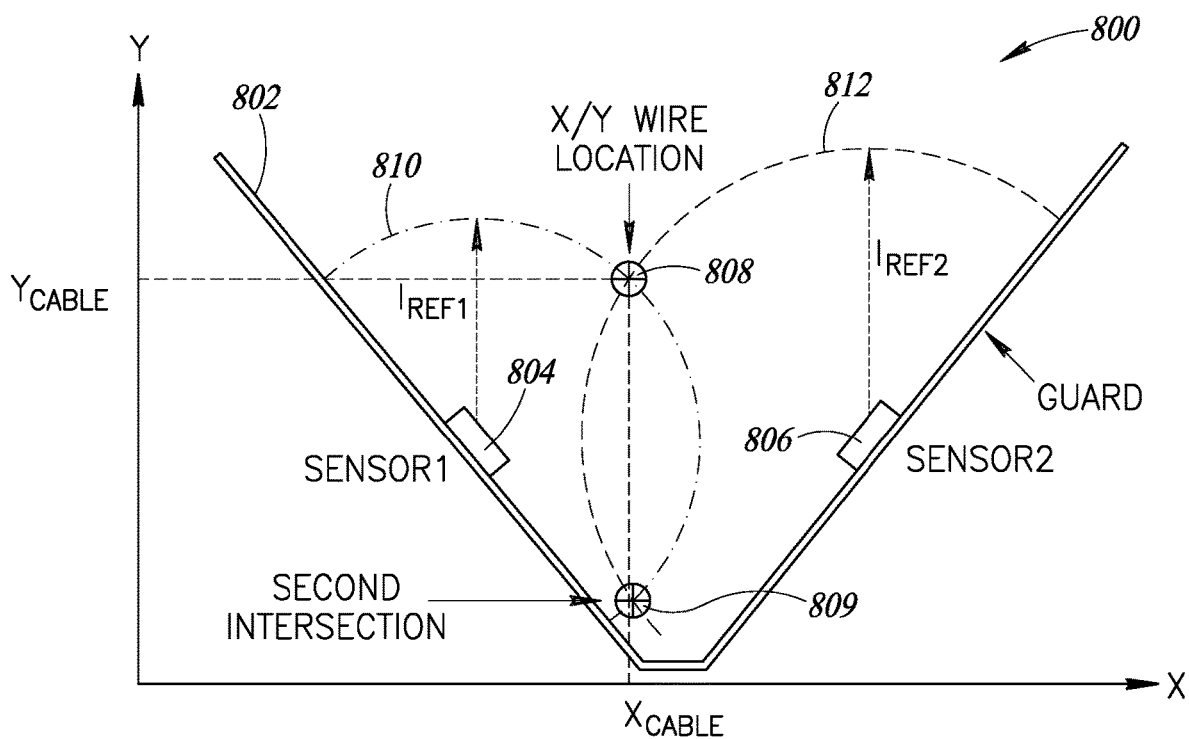
FIG. 8 is a schematic diagram of a V-shaped front end of an electrical parameter measurement device, showing two conductive sensors that may be used to determine the position of a conductor under test, wherein the positions of the two conductive sensors may cause inaccurate position determination for the conductor under test, according to one non-limiting illustrated implementation.

Referring now to FIG. 8, the sensor 804 is positioned at a left side or portion (as shown) of the guard 802, and the sensor 806 is positioned on a right side or portion (as shown) of the guard opposite the left side. A first curved dashed line 810 represents a constant reference current magnitude detected by the sensor 804, and a second curved dashed line 812 represents a constant reference current magnitude detected by the sensor 806. As shown, the curves 810 and 812 intersect at two locations, namely, the actual location of the conductor 808 under test and a second location 809 toward the base of the guard. In this scenario, the measurement device may have difficulty determining in which location the conductor 808 is positioned since there are two intersection points. This issue can be remedied by carefully selecting the locations of the two sensors, as in the example of FIG. 7, so that there is only one intersection of the curves inside the guard, or by using 3 sensors, as in the example of FIG. 6 discussed above.

Figure 9:
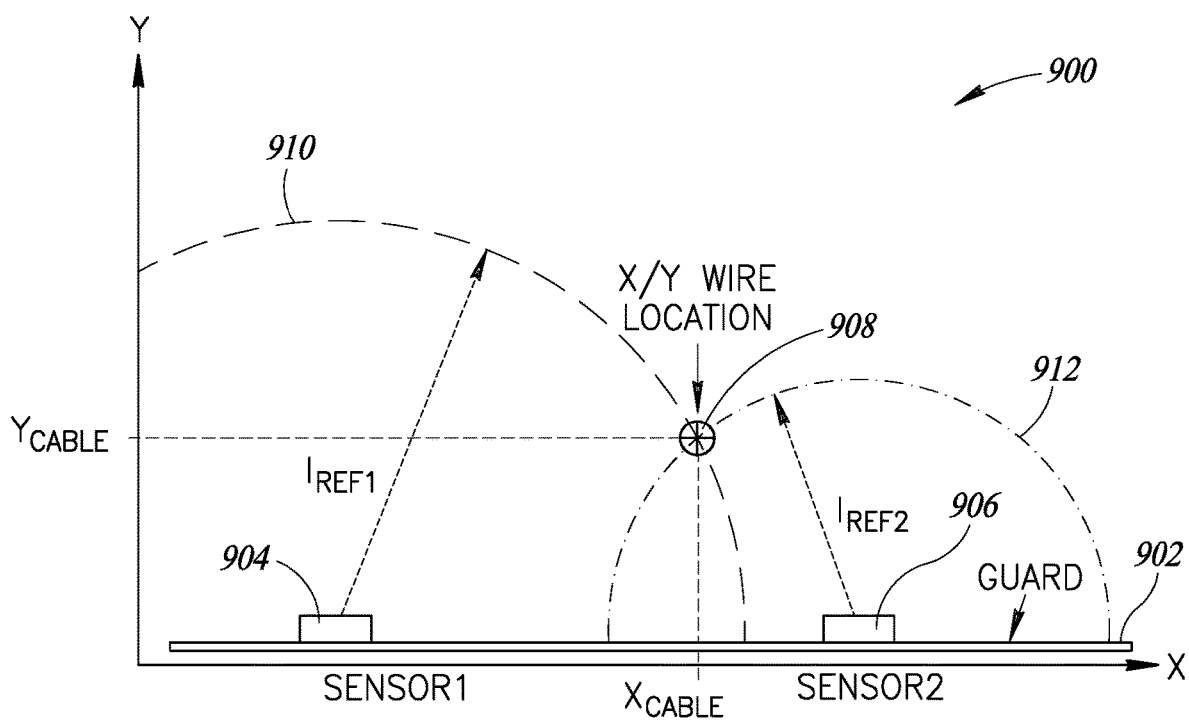
FIG. 9 is a schematic diagram of a front end of an electrical parameter measurement device, showing two conductive sensors that are coplanar with each other and that may be used to determine the position of a conductor under test, according to one non-limiting illustrated implementation.

FIG. 9 is a schematic diagram of a front end 900 of an electrical parameter measurement device, showing two conductive sensors 904 and 906 that are coplanar with each other on a planar guard 902 and that may be used to determine the position of a conductor 908 under test. Constant reference current curves 910 and 912 are also shown for the sensors 904 and 906, respectively. By placing the sensors 904 and 906 coplanar with respect to each other, the curves 910 and 912 intersect each other at only one permissible location (i.e., above the guard 902), thereby avoiding ambiguity that may be caused by two sensors arranged such that the constant reference current curves intersect at two permissible locations, as in the example shown in FIG. 8.

Figure 10:
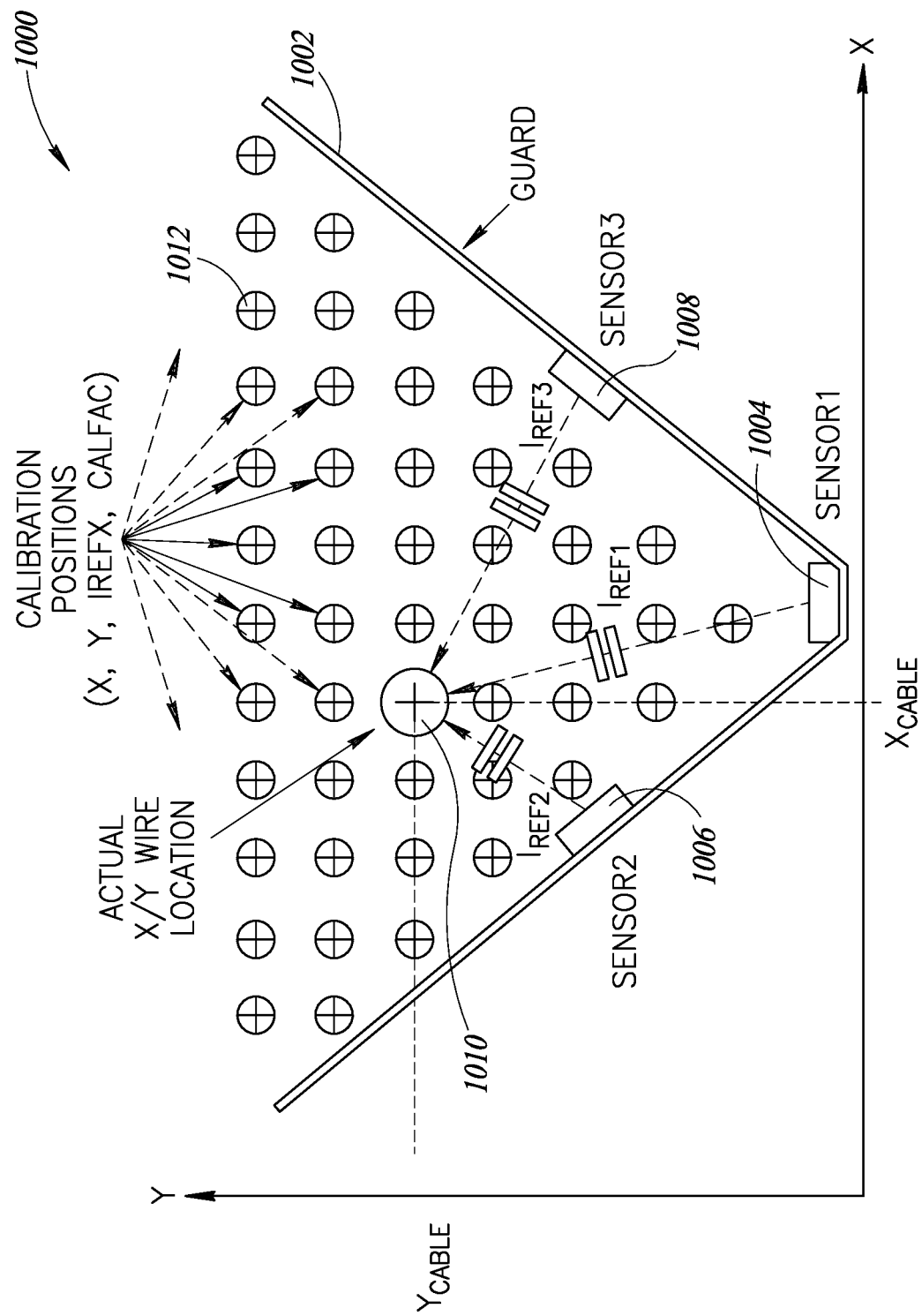
FIG. 10 is a schematic diagram of a V-shaped front end of an electrical parameter measurement device that includes three conductive sensors, showing various possible positions for a conductor under test, according to one non-limiting illustrated implementation.

FIG. 10 is a schematic diagram of a V-shaped front end 1000 of an electrical parameter measurement device that includes three conductive sensors 1004, 4006 and 1008 disposed on a guard 1002, showing various possible positions 1012 for a conductor 1010 under test. The various positions 1012 may be calibration positions or points that may be used during a calibration process to obtain calibration data. For example, when a calibration conductor is positioned at each of the calibration positions 1012, the electrical parameter measurement device may obtain the X/Y position of the calibration conductor, the reference currents $I_{REFX}$ for each of the sensors 1004, 1006 and 1008, and a calibration factor CALFAC that indicates a correction to be applied to obtain an accurate parameter measurement.

FIG. 11 is a table 1100 that shows position dependent calibration factors for the three conductive sensors 1004 (Sensor 1), 1006 (Sensor 2), and 1008 (Sensor 3) of FIG. 10 at various X/Y positions. As shown, for each X/Y position, a reference current IREFX and a calibration factor VCALX are determined for each of the three sensors 1004 (Sensor 1), 1006 (Sensor 2), and 1008 (Sensor 3).

Figure 13:
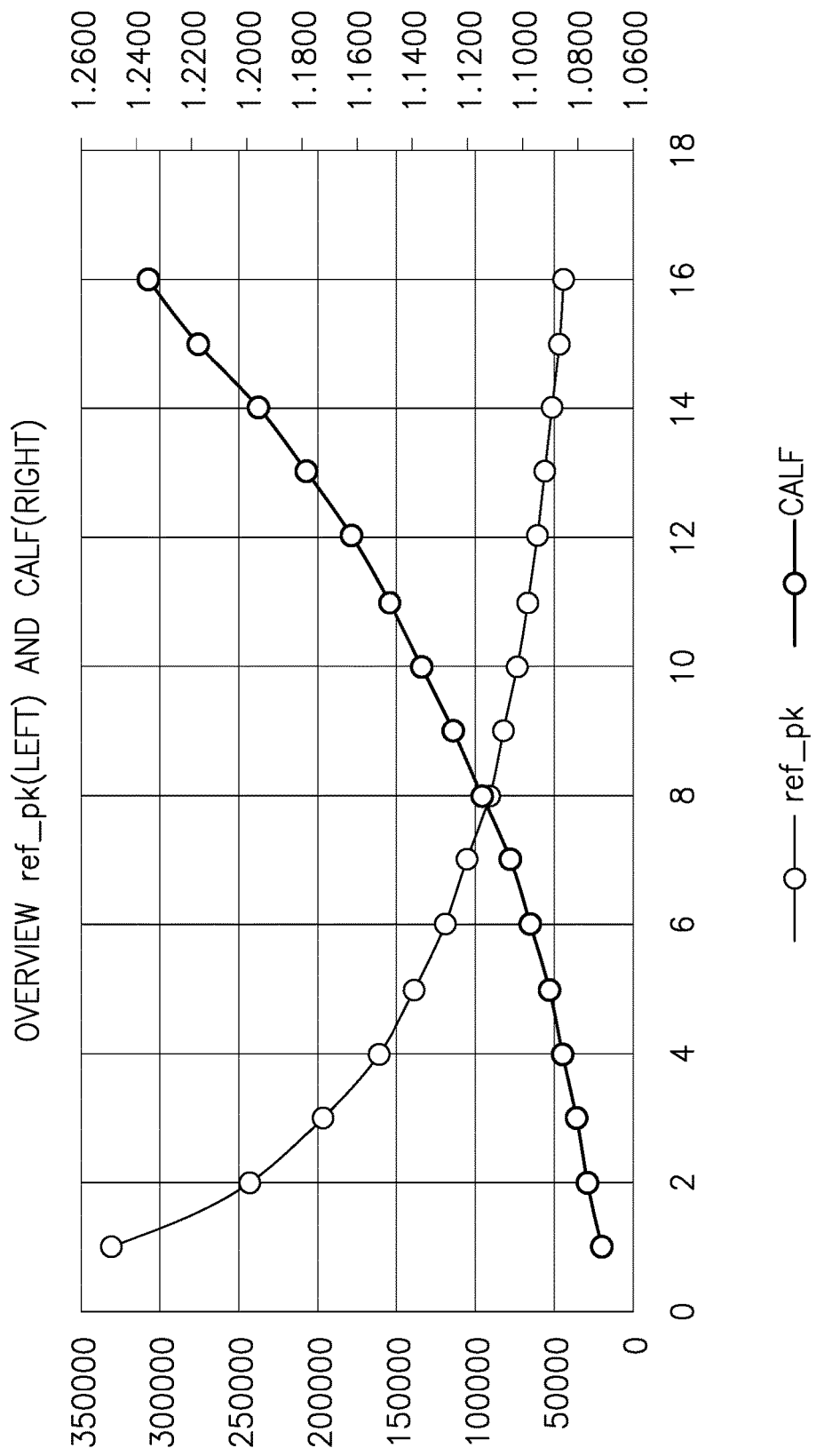
FIG. 13 is a graph that shows a reference current signal of a conductive sensor and a calibration factor as a function of distance, according to one non-limiting illustrated implementation.

FIG. 12 is a table 1200 that shows position dependent calibration factors (CALF) and reference current signals (ref_pk) for a single conductive sensor (e.g., one of the sensors 1004, 1006, or 1008) when a conductor under test is positioned at various distances (DIST) from the conductive sensor. FIG. 13 is a graph 1300 that graphically shows the reference current signal (ref_pk) and calibration factor (CALF) as a function of distance in millimeters (mm). As shown, the reference signal rapidly decreases with distance, and the calibration factor increases with distance.

Figure 14:
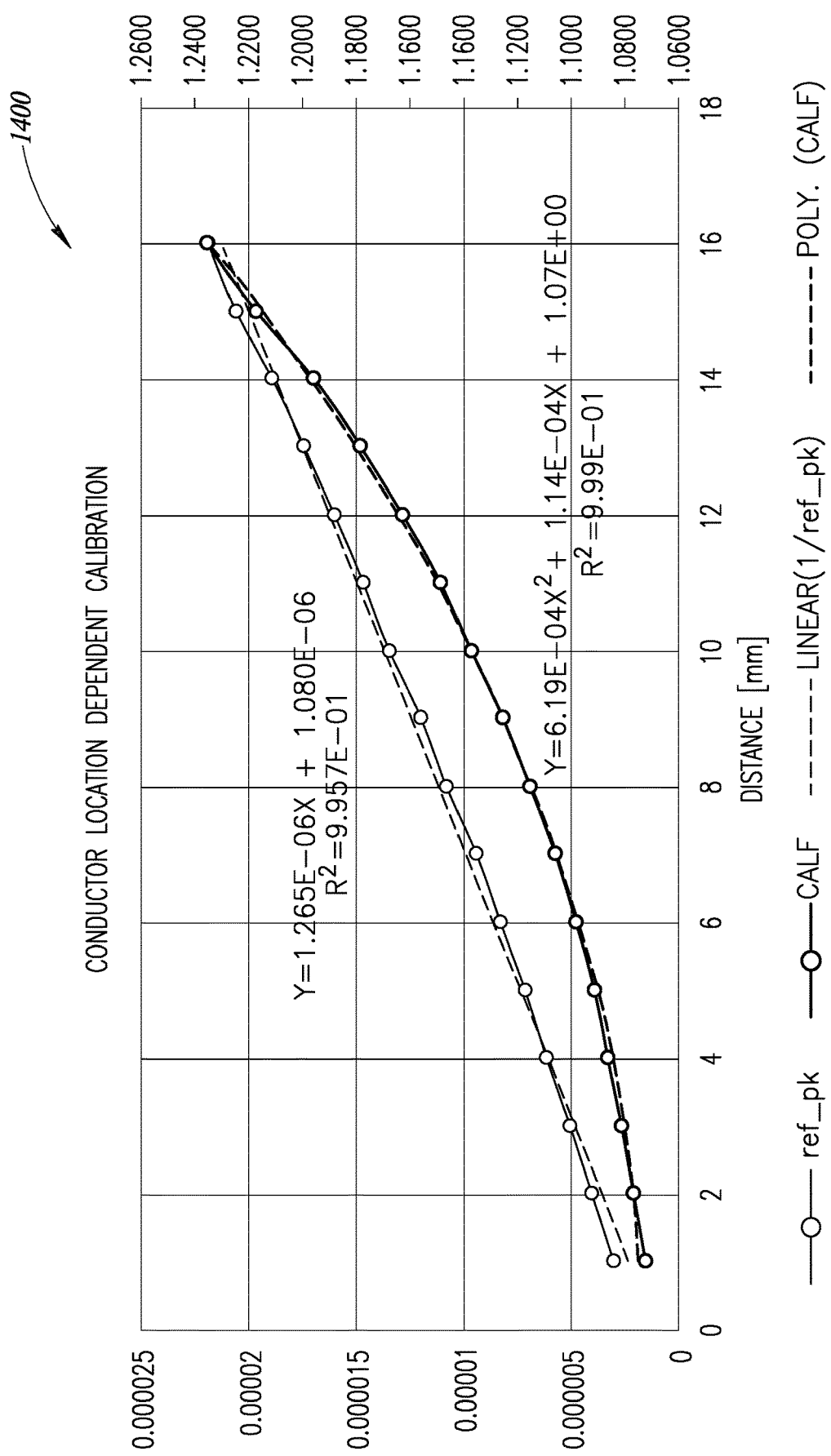
FIG. 14 is a graph that shows a linear approximation of the inverse of a reference current signal and a polynomial approximation of a calibration factor as a function of distance, according to one non-limiting illustrated implementation.

From the graph 1300, it is apparent that the reference current (ref_pk) exhibits some form of 1/x behavior. It may therefore be advantageous to chart the reciprocal value of the reference current, i.e., 1/ref_pk, to derive a simplified and suitably accurate representation. FIG. 14 is a graph 1400 that shows a linear approximation of the inverse of the reference current signal, i.e., 1/ref_pk, and a quadratic approximation of the calibration factor CALF as a function of distance. As shown by the $R^2$ values of 0.9957 and 0.999 for the linear and quadratic approximations, respectively, each of the approximations accurately represent the respective inverse of the reference current signal and the calibration factor as a function of distance.

Figure 15:
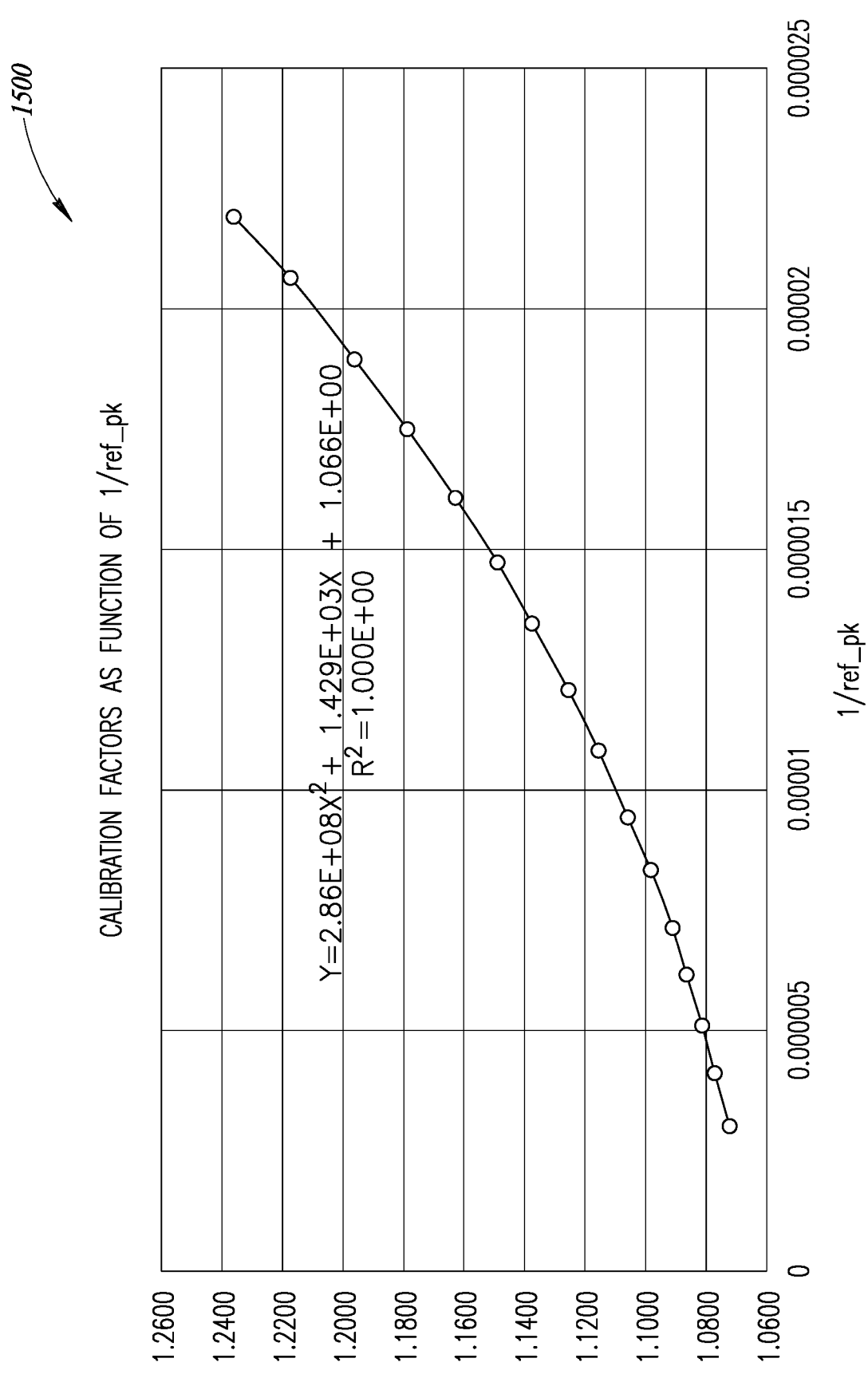
FIG. 15 is a graph that shows a calibration factor as a function of the inverse of a reference current signal detected by a conductive sensor, according to one non-limiting illustrated implementation.

FIG. 15 is a graph of the calibration factor (CALF) as a function of the inverse of the reference current signal, i.e., 1/ref_pk. As shown, the points are approximated by a closely fitting quadratic function that has an $R^2$ value of 1.000.

Figure 16A:
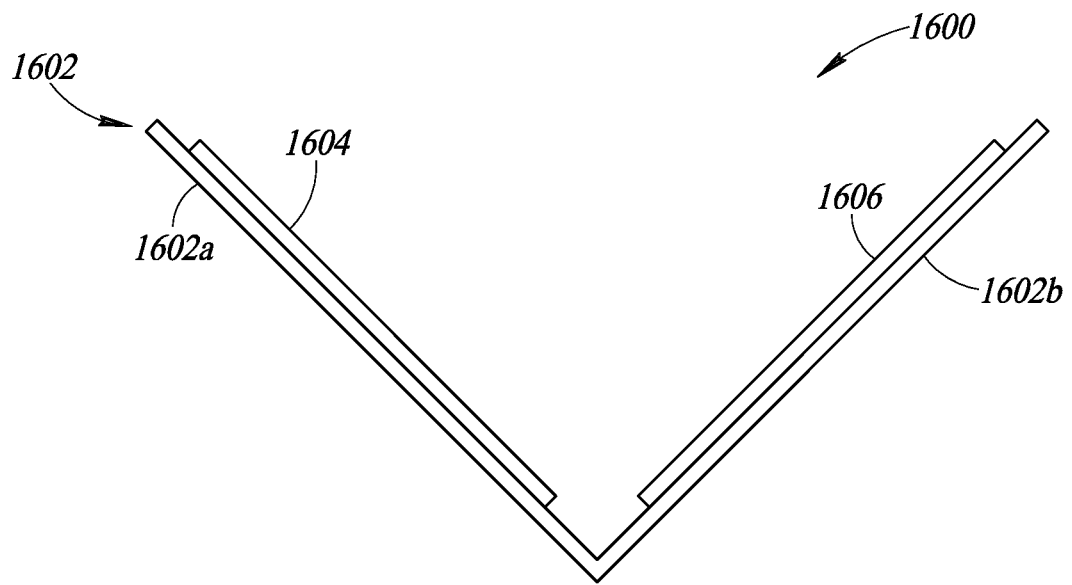
FIG. 16A is a side elevational view of a portion of a front end of an electrical parameter measurement device, showing a V-shaped guard that supports two conductive sensors, according to one non-limiting illustrated implementation.
Figure 16B:
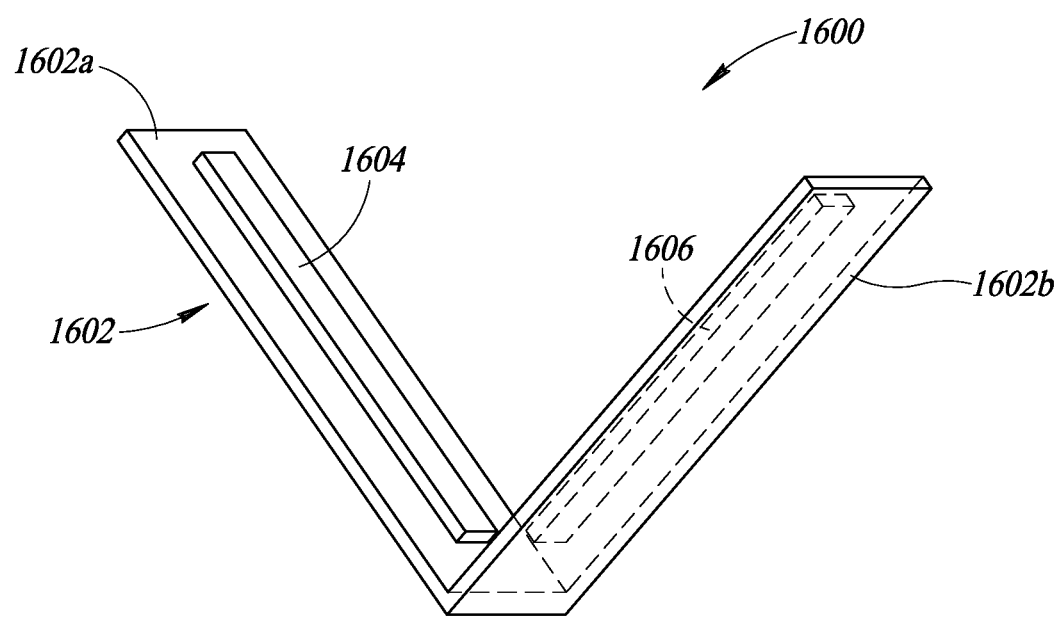
FIG. 16B is a perspective view of the portion of the front end of the electrical parameter measurement device shown in FIG. 16A.

FIGS. 16A and 16B show a portion of a front end 1600 of an electrical parameter measurement device that includes a V-shaped guard 1602 that supports two elongated conductive sensors 1604 and 1606, designated the left sensor and right sensor, respectively, for explanatory purposes. In particular, the guard 1602 includes a left portion 1602a (as shown) that supports the left sensor 1604 and a right portion 1602b that supports the right sensor 1606. Each of the sensors 1604 and 1606 has a length dimension and a width dimension, and the length dimension is larger than the width dimension. As non-limiting example, the length to width ratio may be 1.5:1, 2:1, 4:1, 8:1, 20:1, 100:1, etc. Since the sensors 1604 and 1606 are elongated, it may be assumed or estimated that the only variation in detected signals originates from the normal distance between the conductor under test and each of the sensors, such that influences caused by lateral movement at a constant normal distance may be ignored.

Figure 17:
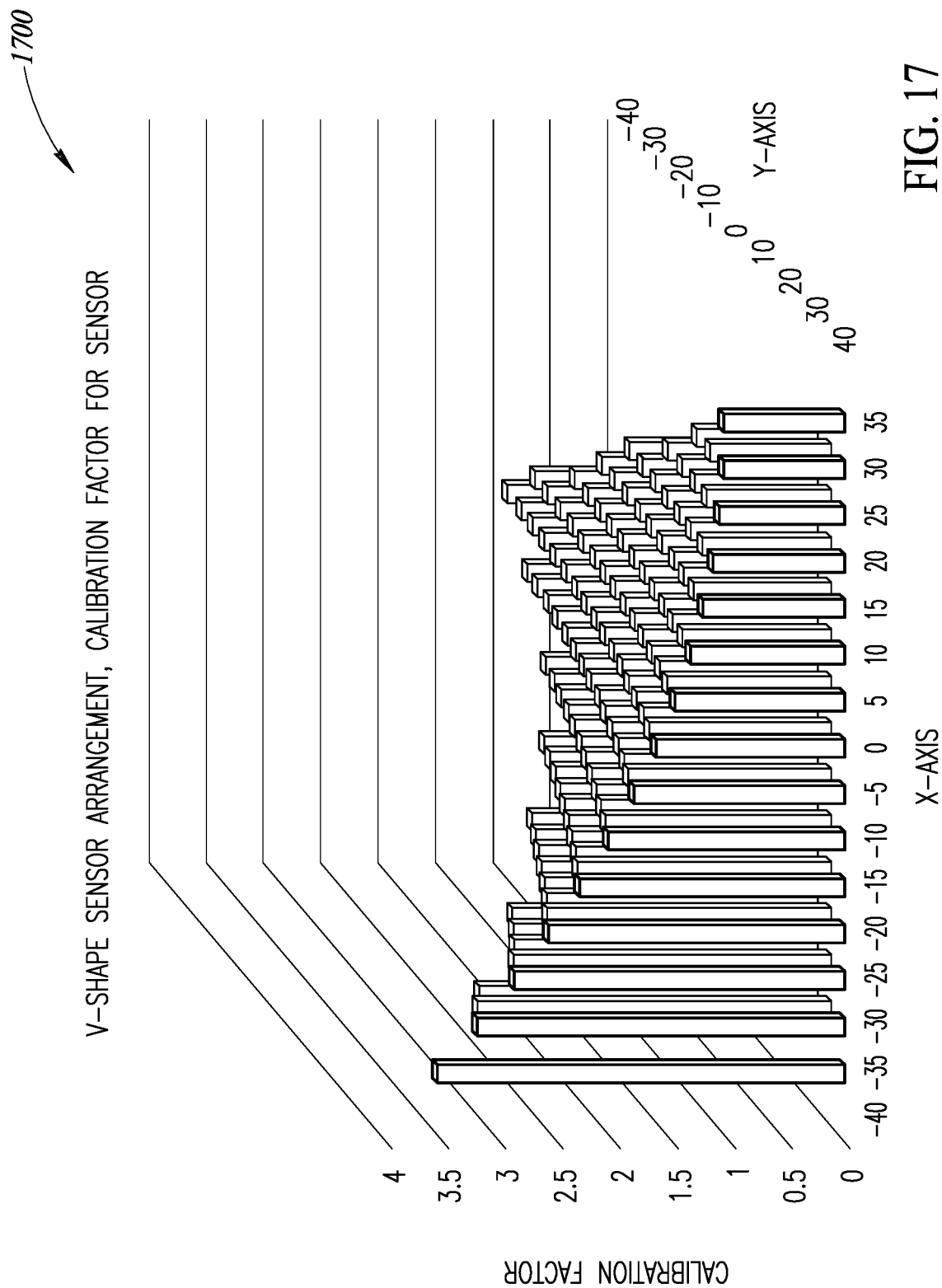
FIG. 17 is a graph that illustrates a schematic representation of the two dimensional normal distance dependence of calibration factors for one of the sensors of the front end shown in FIGS. 16A and 16B, according to one non-limiting illustrated implementation.

Based on the mathematical simplification in representing the distance dependence of the reference current ref_pk and the calibration factor CALF, a measurement grid can be generated that fits within the area of the v-shaped front end 1600. In one example, the sensor 1604 is assumed to be a straight line segment that extends from point A (X=−2; Y=−35) to point B (X=−35; Y=+45) in an X/Y coordinate system, and the sensor 1606 is assumed to be a straight line segment that extends from point A' (X=+2; Y=−35) to point B' (X=+35; Y=+45) in the X/Y coordinate system. For every point, the normal distance to the left sensor 1604 and the right sensor 1606 can be calculated, and the reference current ref_pk and calibration factor CALF derived. A three dimensional representation of the resulting calibration factors for the right sensor 1606 is shown in the graph of FIG. 17.

Figure 18:
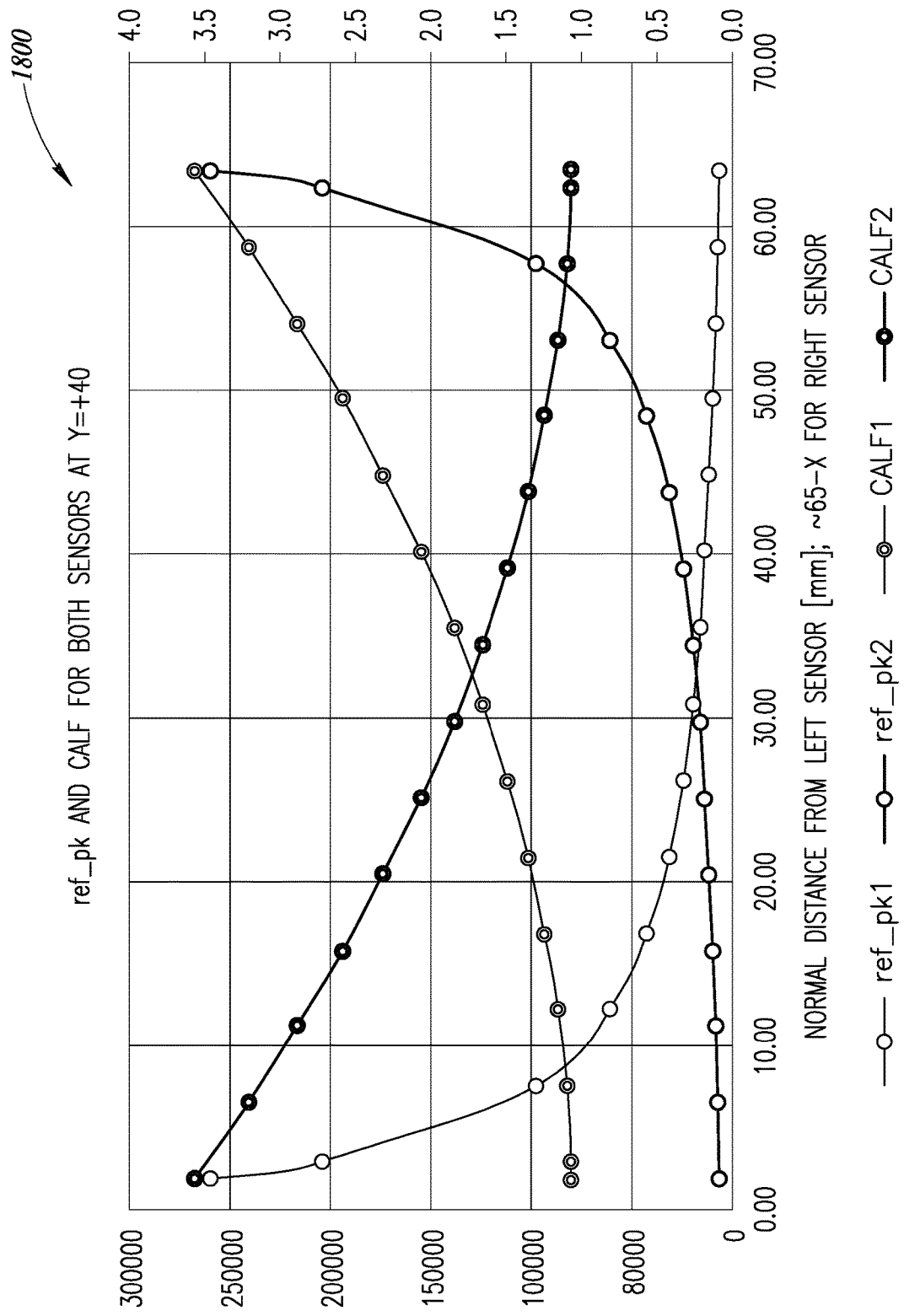
FIG. 18 is a graph that illustrates reference current signals and calibration factors for the two conductive sensors of the front end shown in FIGS. 16A and 16B as a function of normal distance, according to one non-limiting illustrated implementation.

FIG. 18 is a graph 1800 that illustrates reference current signals ref_pk1 and ref_pk2 and calibration factors CALF1 and CALF2 for the sensors 1604 and 1606, respectively, as a function of normal distance, for various X positions when the Y position is fixed at Y=+40.

With a 2D sensor arrangement such as the one shown in FIGS. 16A and 16B, any measurement will provide one value per sensor for the reference current and the corresponding signal measurement. Using such information, the measurement device may determine a suitable calibration factor to compensate for varying distance (e.g., normal distance) to the sensors. Additionally, in at least some implementations, the measurement device may utilize such information to determine the particular X/Y position of a conductor under test.

Figure 19:
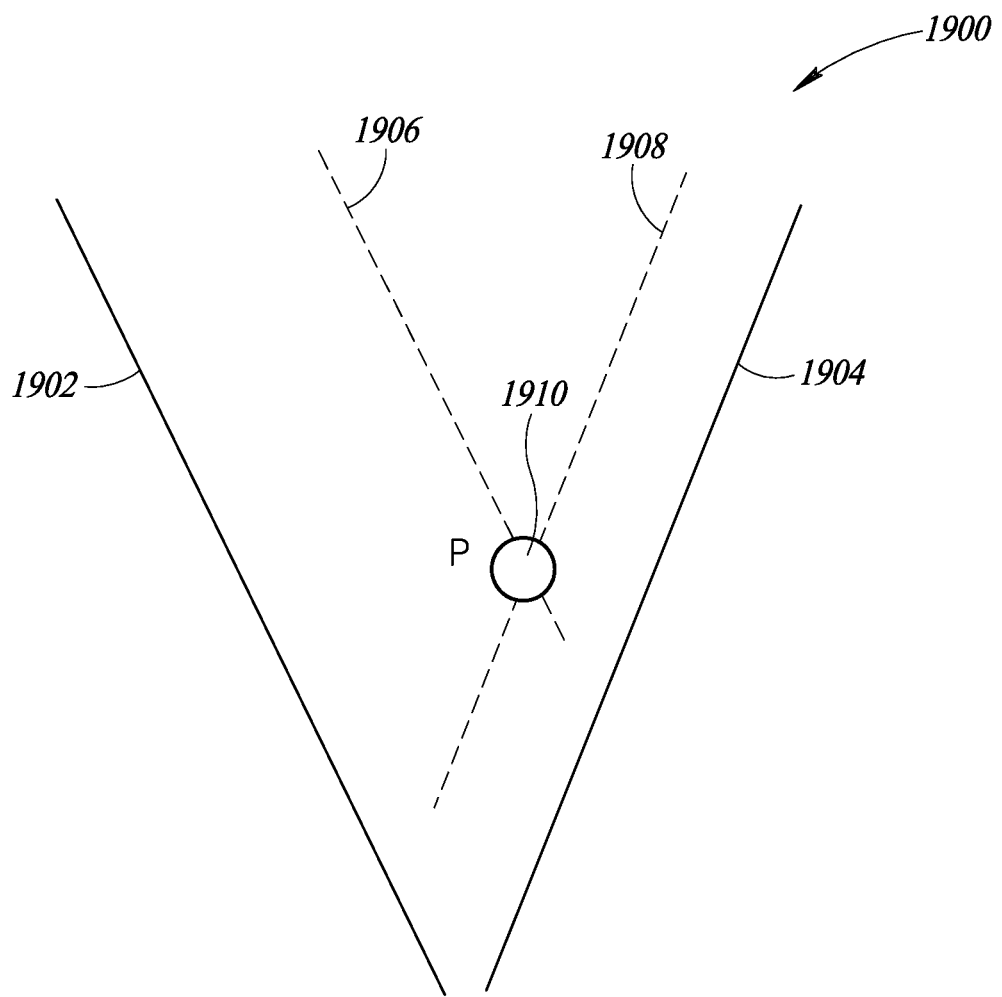
FIG. 19 is a schematic diagram that illustrates position determination for a conductor under test using normal distances derived from reference current signals, according to one non-limiting illustrated implementation.

FIG. 19 shows an example of position determination for a conductor under test using normal distances derived from reference current signals. In FIG. 19, a sensor arrangement 1900 is shown that includes a left sensor 1902 and a right sensor 1904 arranged in a V-shape. A conductor 1910 under test is shown at a position P between the sensors 1902 and 1904. As indicated in the graph 1800 of FIG. 18, the reference current ref_pk can be calculated using the known normal distance. Here, the goal is to derive normal distance information from a measured reference current signal, which requires an inverse function to what is shown in FIG. 18. Since the original functions (ref_pk1 and ref_pk2) are strictly monotonic, respective unique inverse functions can be determined. Then, the inverse functions may be applied to the measured reference currents to obtain normal distance information. In the example shown, a dashed line 1906 indicates the normal distance determined from the sensor 1902, and the dashed line 1908 indicates the normal distance determined from the sensor 1904. The intersection of the lines 1906 and 1908 indicate the location P of the conductor 1910 under test. The location may be used for a variety of purposes including, but not limited to, determining one or more position dependent calibration factors to apply to a measurement of the electrical parameter measurement device to improve its accuracy.

For any given point within the V-shaped arrangement of the sensors discussed herein, one reference current value can be derived for a first sensor (ref_pk1) and one reference current value can be derived for a second sensor (ref_pk2). Based on these values, separate calibration factors can be determined, either through interpolation or by utilizing previously approximated fit functions or other mathematical formulas. Using the two (or more) calibration factors, two (or more) results for the measurement value (e.g., voltage) may be calculated.

In at least some implementations, the measurement device may utilize a weighted combination of the results, or may use only one result if one of the calibration factors is outside a determined range. The weighted combination may be a linear weighted combination, exponential weighted combination, etc.

As a non-limiting example, the device may be configured to ignore calibration factors that are greater than 1.5 since larger calibration factors indicate larger distances and more inaccurate measurements. In such example, useful calibration factors may be determined to range between 1.0 and 1.5, with calibration factors closer to 1.0 deemed to be better than calibration factors closer to 1.5. Thus, a linear or other weighting may be applied such that a weight of 1.0 is applied to a calibration factor of 1.0 and a weight of 0.0 is applied to a calibration factor of 1.5. For example, the weighted measurement result may be found using the following equation:

$$\text{weighted result } [V] = \frac{W(calf1) \cdot \text{Sns1\_result}[V] + W(calf2) \cdot \text{Sns2\_result}[V]}{W(calf1) + W(calf2)}$$

where the weight for each calibration factor is linearly weighted using the formula $W(calfX)=2\times(1.5-calfX)$, and the measurement results for the two sensors are Sns1_result and Sns2_result. In practice, appropriate limits for the calibration factors may be determined using the actual calibration data obtained for a specific instrument or type of instrument.

Figure 20:
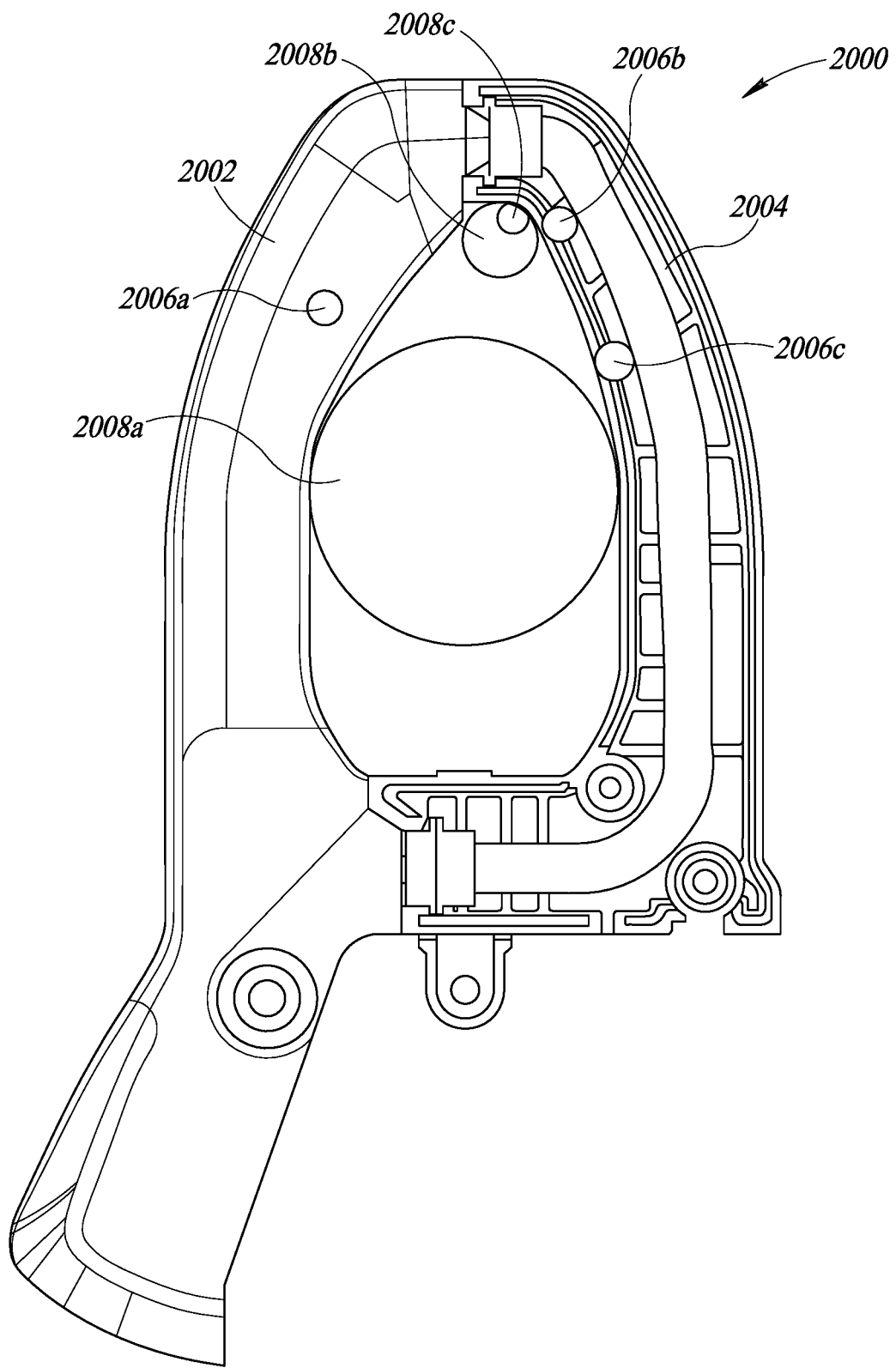
FIG. 20 is a pictorial diagram of a front end of a clamp meter, showing the position of three conductive sensors that may be used to determine the position of a conductor under test and/or to determine one or more calibration factors to be used to improve measurement accuracy, according to one non-limiting illustrated implementation.

FIG. 20 is a pictorial diagram of a front end 2000 of a clamp meter that includes a first clamp portion 2002 and a second clamp portion 2004 that selectively close to form an opening therebetween that is sized and dimensioned to receive a conductor under test, such as the example conductors 2008a, 2008b, and 2008c shown in FIG. 20. In this example, the front end 2000 includes three "point" sensors 2006a, 2006b, and 2006c that may be used to determine the precise location of the conductors 2008 under test, and/or to determine one or more calibration factors to apply to improve measurements of the clamp meter. In the illustrated implementation, the sensors 2006 may be relatively small (e.g., 3×3 mm), which provides an substantially radial variation of detected signals rather than the linear variation provided by the linear sensors 1604 and 1606 shown in FIGS. 16A and 16B. The sensors 2006 may be strategically positioned at locations where the position of a conductor under test may be most accurately determined.

Using the techniques described above, reference current signals may be obtained for each of the sensors 2006a, 2006b, and 2006c, and signals may be processed as discussed above to determine the X/Y location of a conductor under test, which information may be used for calibration or other purposes. For example, an interpolation process may be used to determine the X/Y location and/or calibration factors using obtained reference current signals and previously determined calibration points, as discussed above.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An electrical parameter measurement device, comprising:
   a front end that includes an opening that is sized and dimensioned to receive a conductor under test;
   a plurality of conductive sensors positioned proximate the front end;
   one or more reference voltage sources coupled to the plurality of conductive sensors, the one or more reference voltage sources operative to output a reference voltage in each of the conductive sensors;
   control circuitry communicatively coupled to the one or more reference voltage sources and the plurality of conductive sensors, wherein the control circuitry, in operation:

controls the one or more reference voltage sources to output a reference voltage in each of the conductive sensors;

for each of the conductive sensors, obtains a reference current signal data point indicative of a reference signal that is measured by the conductive sensor when the respective reference voltage source outputs the reference voltage in the conductive sensor and the conductor under test is positioned in the opening of the front end of the electrical parameter measurement device;

determines a calibration factor to be applied to an electrical parameter measurement of the conductor under test based at least in part on the reference current signal data points obtained for each of the plurality of conductive sensors, determines a calibration factor for each of the reference current signal data points; and determines a weighted combination of the calibration factors for each of reference current signal data points to use as the calibration factor to be applied to the electrical parameter measurement of the conductor under test.

2. The electrical parameter measurement device of claim 1, wherein the control circuitry, in operation, applies the determined calibration factor to the electrical parameter measurement to generate a calibrated electrical parameter measurement.

3. The electrical parameter measurement device of claim 1, wherein the electrical parameter measurement comprises one or more of voltage, current, or power.

4. The electrical parameter measurement device of claim 1, wherein the plurality of conductive sensors comprises two or three conductive sensors.

5. The electrical parameter measurement device of claim 1, wherein the electrical parameter measurement device comprises a non-contact voltage measurement device, a current clamp or a split-core transformer.

6. The electrical parameter measurement device of claim 1, wherein the control circuitry, in operation, interpolates between a plurality of previously determined calibration points using the reference current signal data points to determine the calibration factor to be applied to the electrical parameter measurement.

7. The electrical parameter measurement device of claim 1, wherein the control circuitry, in operation, inputs the reference current signal data points into a previously determined calibration formula to determine the calibration factor to be applied to the electrical parameter measurement.

8. The electrical parameter measurement device of claim 1, wherein the plurality of conductive sensors are positioned proximate the front end of the electrical parameter measurement device such that, for each set of reference current signal data points obtained for the plurality of conductive sensors, the control circuitry determines a single position of the conductor under test.

9. The electrical parameter measurement device of claim 8, wherein the control circuitry determines the calibration factor based at least in part on the determined single position of the conductor under test.

10. The electrical parameter measurement device of claim 1, wherein at least two of the plurality of conductive sensors are coplanar with each other.

11. The electrical parameter measurement device of claim 1, wherein each of the plurality of conductive sensors has a length dimension and a width dimension, and the length dimension is larger than the width dimension.

12. The electrical parameter measurement device of claim 1, wherein the weighted combination comprises at least one of a linear weighted combination or an exponential weighted combination.

13. A calibration system operative to calibrate an electrical parameter measurement device, wherein the electrical parameter measurement device, in operation, generates reference current signals in a plurality of conductive sensors and senses the reference current signals in a conductor under test via the plurality of conductive sensors, the calibration system comprising:

a controllable calibration voltage source operative to selectively output a voltage in a calibration conductor;

a conductor position control system operative to selectively control a position of the calibration conductor relative to the plurality of conductive sensors of an electrical parameter measurement device under calibration; and control circuitry communicatively coupleable to the controllable calibration voltage source, the conductor position control system, and the electrical parameter measurement device, wherein the control circuitry, in operation:

obtains a plurality of calibration points, wherein to obtain each of the calibration points, the control circuitry:

controls the conductor position control system to move the calibration conductor to a new physical position proximate the plurality of conductive sensors of the electrical parameter measurement device;

controls the electrical parameter measurement device to output a reference voltage in each of the conductive sensors;

for each of the conductive sensors, obtains a reference current signal data point indicative of a reference signal that is measured by the conductive sensor;

for each of the conductive sensors, determines a calibration factor based at least in part on the reference current signal data point obtained for the conductive sensor, a known voltage of the calibration conductor, and a measured voltage of the calibration conductor received from the electrical parameter measurement device;

logically associates the plurality of calibration factors with the current position of the calibration conductor; and determines calibration data based on the obtained plurality of calibration points; and stores the calibration data on at least one nontransitory processor-readable storage medium for subsequent use by one or more electrical parameter measurement devices.

14. The calibration system of claim 13 wherein the calibration data comprises a lookup table that, in operation, allows an electrical parameter measurement device to determine a calibration factor for particular reference current signal measurements.

15. The calibration system of claim 13 wherein the calibration data comprises coefficients for one or more mathematical formulas.

16. A method of operating a calibration system to calibrate an electrical parameter measurement device, wherein the electrical parameter measurement device, in operation, generates reference current signals in a plurality of conductive sensors and senses the reference current signals in a conductor under test via the plurality of conductive sensors, the method comprising:

obtaining a plurality of calibration points by, for each calibration point:

moving a calibration conductor to a new physical position proximate the plurality of conductive sensors of the electrical parameter measurement device while the electrical parameter measurement device outputs a reference voltage in each of the conductive sensors;

for each of the conductive sensors of the electrical parameter measurement device, obtaining a reference current signal data point indicative of a reference signal that is measured by the conductive sensor;

for each of the conductive sensors, determining a calibration factor based at least in part on the reference current signal data point obtained for the conductive sensor, a known voltage of the calibration conductor, and a measured voltage of the calibration conductor received from the electrical parameter measurement device;

logically associating the plurality of calibration factors with the current position of the calibration conductor; and determining calibration data based on the obtained plurality of calibration points; and storing the calibration data on at least one nontransitory processor-readable storage medium for subsequent use by one or more electrical parameter measurement devices.

17. The method of claim 16 wherein determining calibration data comprises generating a lookup table that, in operation, allows the electrical parameter measurement device to determine a calibration factor for particular reference current signal measurements.

18. The method of claim 16 wherein determining calibration data comprises determining coefficients for one or more mathematical formulas.

* * * * *